(12) United States Patent
Ahn et al.

(10) Patent No.: US 12,362,138 B2
(45) Date of Patent: Jul. 15, 2025

(54) METHOD OF OPERATING SCANNING ELECTRON MICROSCOPE (SEM) AND METHOD OF MANUFACTURING SEMICONDUCTOR DEVICE USING THE SAME

(71) Applicant: Samsung Electronics Co., Ltd., Suwon-si (KR)

(72) Inventors: Jaehyung Ahn, Seoul (KR); Kwangeun Kim, Suwon-si (KR); Souk Kim, Seoul (KR); Younghoon Sohn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 437 days.

(21) Appl. No.: 17/879,515

(22) Filed: Aug. 2, 2022

(65) Prior Publication Data

US 2023/0140892 A1    May 11, 2023

(30) Foreign Application Priority Data

Nov. 11, 2021 (KR) .................. 10-2021-0155159

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/226* (2013.01); *H01J 37/244* (2013.01)

(58) Field of Classification Search
CPC .... H01J 37/28; H01J 37/244; H01J 2237/057; H01J 2237/221; H01J 2237/2448; H01J 2237/24495; H01J 2237/2817; H01J 37/222; H01J 37/147
See application file for complete search history.

(56) References Cited

U.S. PATENT DOCUMENTS

| | | | |
|---|---|---|---|
| 5,408,098 A * | 4/1995 | Wells .................... | H01J 37/244 250/305 |
| 6,384,408 B1 * | 5/2002 | Yee ......................... | H01J 37/28 250/252.1 |
| 6,646,262 B1 * | 11/2003 | Todokoro ............... | H01J 37/244 850/9 |
| 6,784,425 B1 | 8/2004 | Lorusso et al. | |
| 6,979,824 B1 * | 12/2005 | Adler ..................... | H01J 37/244 850/10 |
| 7,049,591 B2 * | 5/2006 | Todokoro ................ | H01J 37/28 250/305 |

(Continued)

*Primary Examiner* — David A Vanore
(74) *Attorney, Agent, or Firm* — HARNESS, DICKEY & PIERCE, P.L.C.

(57) ABSTRACT

A scanning electron microscope (SEM) includes an electron gun, a deflector, an objective lens, first and second detectors each configured to detect emission electrons emitted from the wafer based on the input electron beam being irradiated on the wafer, a first energy filter configured to block electrons having energy less than a first energy among emission electrons emitted from a wafer based on an input electron beam from being detected by the first detector, and a second energy filter configured to block electrons having energy less than second energy among the emission electrons from being detected by the second detector.

20 Claims, 18 Drawing Sheets

(56) References Cited

U.S. PATENT DOCUMENTS

| | | | |
|---|---|---|---|
| 7,276,694 B1* | 10/2007 | Bertsche | H01J 37/244 250/311 |
| 9,048,062 B1* | 6/2015 | Ren | H01J 37/05 |
| 9,159,529 B2* | 10/2015 | Yamazaki | H01J 37/28 |
| 9,336,984 B2* | 5/2016 | Bizen | H01J 37/28 |
| 9,536,703 B2 | 1/2017 | Agemura et al. | |
| 10,643,819 B2* | 5/2020 | Masnaghetti | H01J 37/10 |
| 2001/0010357 A1* | 8/2001 | Ose | H01J 37/147 250/311 |
| 2003/0127604 A1* | 7/2003 | Todokoro | H01J 37/244 250/436 |
| 2003/0178580 A1* | 9/2003 | Harnack | B82B 3/00 250/492.2 |
| 2003/0230714 A1* | 12/2003 | Yonezawa | H01J 37/244 250/310 |
| 2005/0087686 A1* | 4/2005 | Honda | G01N 23/2251 250/311 |
| 2005/0190310 A1* | 9/2005 | Koyama | G01R 31/311 349/5 |
| 2005/0279937 A1* | 12/2005 | Koike | H01J 37/28 250/310 |
| 2007/0029478 A1* | 2/2007 | Sato | H01J 37/28 250/310 |
| 2007/0040118 A1* | 2/2007 | Cheng | G01N 23/2251 250/310 |
| 2007/0057183 A1* | 3/2007 | Arai | H01J 37/026 250/310 |
| 2008/0116375 A1* | 5/2008 | Ikegami | H01J 37/244 250/311 |
| 2009/0272899 A1* | 11/2009 | Yamazaki | H01J 37/292 250/306 |
| 2010/0033560 A1* | 2/2010 | Kawasaki | G01N 23/203 250/306 |
| 2010/0163725 A1* | 7/2010 | Barkshire | H01J 37/256 250/307 |
| 2011/0163229 A1* | 7/2011 | Frosien | H01J 37/28 250/396 ML |
| 2011/0291010 A1* | 12/2011 | Katane | H01J 37/244 250/310 |
| 2012/0126118 A1* | 5/2012 | Suzuki | H01J 37/026 250/310 |
| 2013/0292568 A1* | 11/2013 | Bizen | H01J 37/244 250/311 |
| 2014/0001360 A1* | 1/2014 | Kasai | H01J 37/28 250/307 |
| 2014/0124666 A1* | 5/2014 | Sasaki | H01J 37/244 250/310 |
| 2014/0175277 A1* | 6/2014 | Lanio | H01J 37/244 250/307 |
| 2015/0357158 A1* | 12/2015 | Suzuki | H01J 37/28 250/307 |
| 2016/0148782 A1* | 5/2016 | Agemura | H01J 37/28 250/310 |
| 2016/0372304 A1* | 12/2016 | Masnaghetti | G01N 23/203 |
| 2016/0379795 A1* | 12/2016 | Watanabe | H01J 37/28 250/310 |
| 2018/0005797 A1* | 1/2018 | Kato | H01J 37/244 |
| 2018/0012725 A1* | 1/2018 | Yokosuka | H01J 37/292 |
| 2018/0182595 A1* | 6/2018 | Yokosuka | H01J 37/222 |
| 2019/0362931 A1* | 11/2019 | Watanabe | H01J 37/222 |
| 2019/0385810 A1* | 12/2019 | Sato | H01J 37/244 |
| 2020/0258713 A1* | 8/2020 | Mizuhara | H01J 37/244 |
| 2020/0294756 A1* | 9/2020 | Yokosuka | H01J 37/28 |
| 2020/0321191 A1* | 10/2020 | Ren | H01J 37/3177 |
| 2020/0363350 A1* | 11/2020 | Irie | G03F 7/70625 |
| 2020/0365365 A1* | 11/2020 | Yamamoto | H01J 37/222 |
| 2020/0373120 A1* | 11/2020 | Yuli | H01J 37/222 |
| 2021/0116398 A1* | 4/2021 | Ren | H01J 37/244 |
| 2021/0272770 A1* | 9/2021 | Sohda | H01J 37/153 |
| 2021/0366685 A1* | 11/2021 | Yokosuka | H01J 37/222 |
| 2022/0037112 A1* | 2/2022 | Tani | H01J 37/28 |
| 2022/0406558 A1* | 12/2022 | Morishita | H01J 37/073 |
| 2023/0140892 A1* | 5/2023 | Ahn | H01J 37/28 250/305 |
| 2023/0411108 A1* | 12/2023 | Kotsuji | H01J 37/026 |

* cited by examiner

METHOD OF OPERATING SCANNING ELECTRON MICROSCOPE (SEM) AND METHOD OF MANUFACTURING SEMICONDUCTOR DEVICE USING THE SAME

CROSS-REFERENCE TO RELATED APPLICATION

This application is based on and claims priority under 35 U.S.C. § 119 to Korean Patent Application No. 10-2021-0155159, filed on Nov. 11, 2021, in the Korean Intellectual Property Office, the disclosure of which is incorporated by reference herein in its entirety.

BACKGROUND

The inventive concepts relate to methods of operating scanning electron microscopes (SEM) and methods of manufacturing semiconductor devices using the same.

An SEM may analyze topographical information of a shape of a surface of a sample, morphological information such as shapes and sizes of particles constituting the sample, and crystallographic information such as an arrangement of atoms in the sample.

The SEM has enabled observations of microstructures that may not be measured due to limitations on resolution of an optical microscope and is being applied to various fields such as medicine, biotechnology, biology, microbiology, materials engineering, and food engineering. Particularly, as a low vacuum SEM enables observing an image in low vacuum conditions, application of the SEM is expanding.

SUMMARY

The inventive concepts relate to scanning electron microscopes (SEM) with improved measurement sensitivity.

According to some example embodiments of the inventive concepts, an SEM may include an electron gun configured to generate an input electron beam and to irradiate the input electron beam onto a wafer, a deflector on a path of the input electron beam between the electron gun and the wafer and configured to deflect the path of the input electron beam, an objective lens on the path of the input electron beam between the deflector and the wafer and configured to focus the input electron beam on the wafer, a first detector and a second detector, a first energy filter and a second energy filter, and a processor. The first energy filter may be configured to detect a first portion of emission electrons emitted from the wafer based on the input electron beam being irradiated on the wafer. The first detector may be configured to generate a first image based on the first portion of the emission electrons. The second detector may be configured to detect a second portion of the emission electrons and to generate a second image based on the second portion of the emission electrons. The first energy filter may be configured to block electrons having energy less than first energy among the emission electrons from being detected by the first detector. The second energy filter may be configured to block electrons having energy less than second energy among the emission electrons from being detected by the second detector. The processor may be configured to generate an image of the wafer based on a third portion of the emission electrons having energy between the first energy and the second energy, the processor configured to generate the image of the wafer based on the first image and the second image.

According to some example embodiments, an SEM may include an electron gun configured to generate an input electron beam and to irradiate the input electron beam onto a wafer, a deflector on a path of the input electron beam between the electron gun and the wafer and configured to deflect the path of the input electron beam, an objective lens on the path of the input electron beam between the deflector and the wafer and configured to focus the input electron beam on the wafer, a first energy filter on the path of the input electron beam between the objective lens and the wafer and configured to block electrons having energy less than a first energy among emission electrons emitted from the wafer based on the input electron beam being irradiated on the wafer, the first energy filter configured to neutralize charges induced to the wafer, a first detector configured to detect a first portion of the emission electrons and to generate a first image based on the first portion of the emission electrons, and a second detector configured to detect a second portion of the emission electrons and to generate a second image based on the second portion of the emission electrons.

According to some example embodiments, an SEM may include an electron gun configured to generate an input electron beam and to irradiate the input electron beam onto a wafer, deflector on a path of the input electron beam between the electron gun and the wafer and configured to deflect the path of the input electron beam, an objective lens on the path of the input electron beam between the deflector and the wafer and configured to focus the input electron beam on the wafer, an energy filter configured to block electrons having energy less than or equal to a blocking energy among emission electrons emitted from the wafer based on the input electron beam being irradiated on the wafer, the energy filter configured to control the blocking energy to be a first energy greater than 50 eV and a second energy greater than the first energy, a detector configured to sense a first portion of the emission electrons having energy greater than or equal to the first energy and a second portion of the emission electrons having energy greater than or equal to the second energy, and a processor configured to perform a differential operation on a signal generated by the first portion of the emission electrons having energy greater than or equal to the first energy and another signal generated by a third portion of the emission electrons having energy less than or equal to the second energy.

According to some example embodiments, a method of inspecting a wafer may include setting a first energy as a blocking energy of a first energy filter and setting a second energy as a blocking energy of a second energy filter, irradiating an input electron beam onto the wafer and sensing emission electrons emitted from the wafer in response to the input electron beam being irradiated onto the wafer to generate a first image and a second image, wherein the first image is generated based on a first portion of the emission electrons having energy greater than or equal to the first energy, wherein the second image is generated based on a second portion of the emission electrons having energy greater than or equal to the second energy, and the first energy is less than the second energy, and performing a differential operation on the first image and the second image to generate a differential image.

According to some example embodiments, a method of manufacturing a semiconductor device may include forming a mold including a plurality of insulating layers and a plurality of sacrificial layers that are alternately stacked on a wafer and a plurality of channel structures passing through the mold in a vertical direction, forming a word line cut vertically passing through the mold to expose the plurality of sacrificial layers, removing the sacrificial layers and forming gate electrodes between the insulating layers, wherein each of the gate electrodes that underlies at least one of the gate electrodes horizontally protrudes from an overlying gate electrode of the gate electrodes, forming contact holes exposing top surfaces of the gate electrodes, and measuring the contact holes. The measuring of the contact holes may include setting a first energy as blocking energy of a first energy filter and setting a second energy as blocking energy of a second energy filter, irradiating an input electron beam onto the wafer and sensing emission electrons emitted from the wafer in response to the input electron beam being irradiated onto the wafer to generate a first image and a second image, wherein the first image is generated based on a first portion of the emission electrons having energy greater than or equal to the first energy, wherein the second image is generated based on a second portion of the emission electrons having energy greater than or equal to the second energy, and the first energy is less than the second energy, and performing a differential operation on the first image and the second image to generate a differential image.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
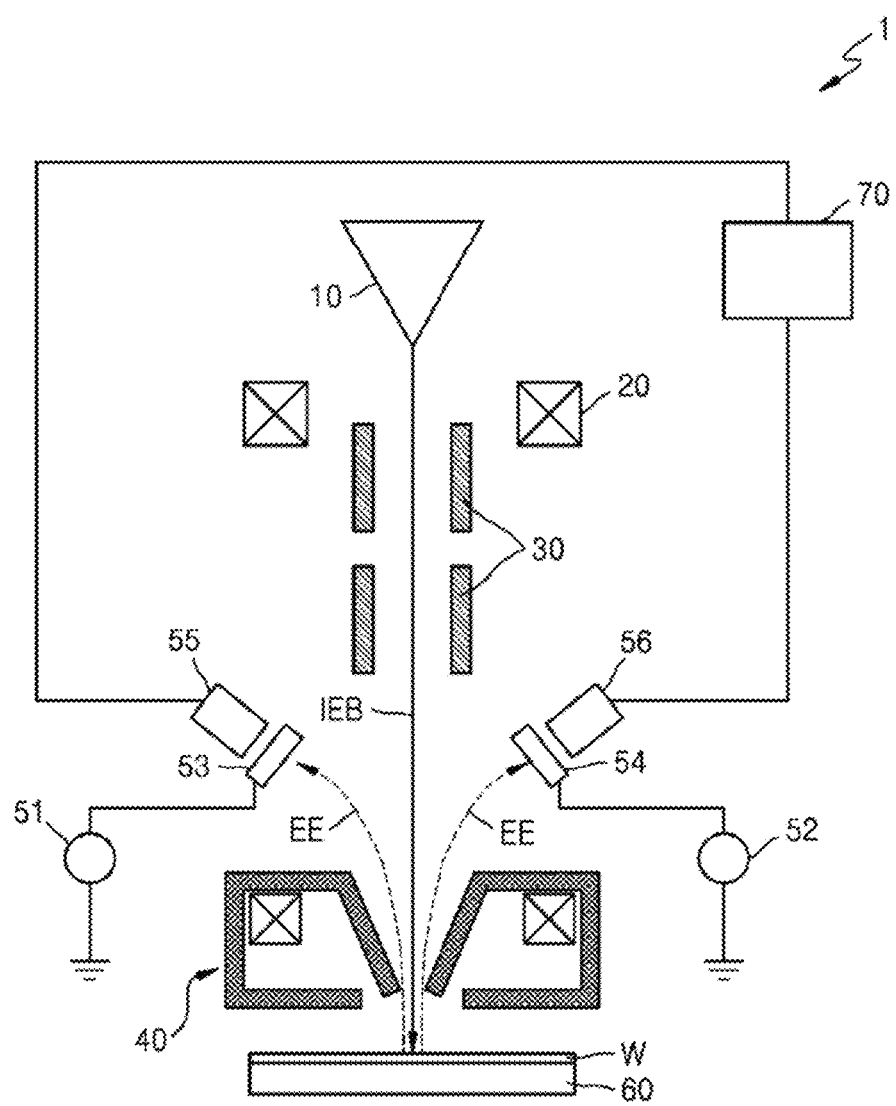
FIG. 1 is a view illustrating a scanning electron microscope (SEM) according to some example embodiments.

Hereinafter, some example embodiments of the inventive concepts will be described in detail with reference to the accompanying drawings. Like reference numerals refer to like elements throughout and description thereof will not be given.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., +10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

FIG. 1 is a view illustrating a scanning electron microscope (SEM) 1 according to some example embodiments.

The SEM 1 may measure a wafer W. According to some example embodiments, the SEM 1 may measure the wafer W, on which manufacturing processes of a semiconductor device are performed by a scanning method. According to some example embodiments, the SEM 1 may obtain topographical information of the wafer W, morphological information such as shapes and sizes of particles constituting the wafer W, and crystallographic information such as an arrangement of atoms in the wafer W by measuring the wafer W.

According to some example embodiments, the SEM 1 may evaluate the manufacturing processes of the semiconductor device, which are performed on the wafer W, by irradiating an input electron beam IEB onto the wafer W and detecting emission electrons EE emitted from the wafer W by an interaction between the input electron beam IEB and the wafer W. The emission electrons EE may be generated by elastic scattering or inelastic scattering.

The elastic scattering is a phenomenon in which electrons in the input electron beam IEB are directed in a direction opposite to an input direction of the input electron beam IEB without a change in energy of the electrons in the input electron beam IEB by electric potential of atomic nuclei constituting the wafer W. Electrons escaping from a surface of the wafer W by the elastic scattering may be referred to as backscattered electrons, and the backscattered electrons may have energy of about 50 eV or more. The backscattered electrons may include information on a structure and composition near the surface of the wafer W.

The inelastic scattering is a phenomenon in which, when the electrons in the input electron beam IEB are incident on the surface of the wafer W, due to an interaction between the atoms in the wafer W and electrons on an electron orbit, electrons in the atoms in the wafer W are emitted. By the inelastic scattering, secondary electrons, Auger electrons, and X-rays may be emitted. Among the emission electrons EE, the secondary electrons may have energy of about several eVs. The secondary electrons may include information on irregularities near the surface of the wafer W.

The secondary electrons are released from bondage of atoms by energy transmitted by the electrons in the input electron beam IEB. When electrons at a low energy level other than a valence band are emitted as the secondary electrons, electrons at a high energy level may move to the low energy level so that the X-rays may be emitted. Electrons released by the excitation due to the X-rays are called the Auger electrons. The X-rays may include continuum X-rays and characteristic X-rays. The Auger electrons and the X-rays may include information on composition and chemical bonding near the surface of the wafer W.

The SEM 1 may further detect signals generated by incoherent scattered electrons, transmitted electrons, and cahtodoluminescence.

The SEM 1 may include an electron gun 10, a focusing lens 20, a deflector 30, an objective lens 40, a first power source 51, a second power source 52, a first energy filter 53, a second energy filter 54, a first detector 55, a second detector 56, a stage 60, and a processor 70.

The electron gun 10 may generate and emit the input electron beam IEB. A wavelength of the input electron beam IEB may be determined by energy of electrons emitted from the electron gun 10. According to some example embodiments, the wavelength of the input electron beam IEB may be several nms. According to some example embodiments, the electron gun 10 may include one of a cold field emission (CFE)-type electron gun, a Schottky emission (SE)-type electron gun, and a thermionic emission (TE)-type electron gun.

The electronic gun 10 may generate the input electron beam IEB by thermally or electrically applying energy of greater than or equal to a work function (that is, a difference between an energy level and Fermi energy in vacuum) to electrons in a solid material that is an electronic source.

The focusing lens 20 may be arranged on a path of the input electron beam IEB between the electron gun 10 and the wafer W. According to some example embodiments, the focusing lens 20 may focus the input electron beam IEB on the deflector 30. Therefore, controllability of the input electron beam IEB by the deflector 30 may also be improved.

The deflector 30 may be arranged on the path of the input electron beam IEB between the focusing lens 20 and the wafer W. The deflector 30 may deflect the input electron beam IEB emitted from the electron gun 10. The deflector 30 may deflect the input electron beam IEB so that the input electron beam IEB may pass through the focusing lens 20 and the objective lens 40 to be irradiated onto the wafer W in a set position. According to some example embodiments, the deflector 30 may scan the input electron beam IEB on the wafer W. The deflector 30 may include an electrical-type deflector or a magnetic-type deflector.

As described herein, when an element is described to be "on" the path of the input electron beam IEB, the path of the input electron beam IEB may intersect at least a portion of the element and/or the element may at least partially surround the input electrode beam such that a central axis of the element may be paraxial and/or coaxial with the path of the input electron beam IEB passing through a volume space defined by outermost surfaces of the element.

As shown in FIG. 1, the first and second energy filters 53 and 54 may each be apart (e.g., spaced apart, isolated from direct contact with, etc.) from the path of the input electron beam IEB, such that each of the first and second energy filters 53 and 54 may not be intersected by the path of the input electron beam IEB.

The objective lens 40 may be arranged on the path of the input electron beam IEB between the deflector 30 and the wafer W. The objective lens 40 may focus the input electron beam IEB on the wafer W. As the input electron beam IEB is limited to a narrow region on the wafer W, the resolution of the SEM 1 may increase.

In the above, a system for transmitting the input electron beam IEB, including the focusing lens 20, the deflector 30, and the objective lens 40, is described. However, the inventive concepts are not limited thereto. Those skilled in the art may easily reach the system transmitting the input electron beam IEB, including additional focusing lenses and deflectors, based on the description given herein. As shown, emission electrons EE may be emitted from the wafer W based on the input electron beam IEB being irradiated on the wafer W.

The first power source 51 may supply power for filtering the emission electrons EE to the first energy filter 53. According to some example embodiments, the first energy filter 53 may include a high pass filter. According to some example embodiments, blocking energy of the first energy filter 53 may be the first energy E1 (refer to FIG. 3). According to some example embodiments, the first energy filter 53 may block electrons having energy less than the first energy E1 (refer to FIG. 3) among the emission electrons EE.

The second power source 52 may supply power for filtering the emission electrons EE to the second energy filter 54. According to some example embodiments, the second energy filter 54 may be a high pass filter. According to some example embodiments, blocking energy of the second energy filter 54 may be the second energy E2 (refer to FIG. 3). According to some example embodiments, the second energy filter 54 may block electrons having energy less than the second energy E2 (refer to FIG. 3) among the emission electrons EE.

Figure 3:
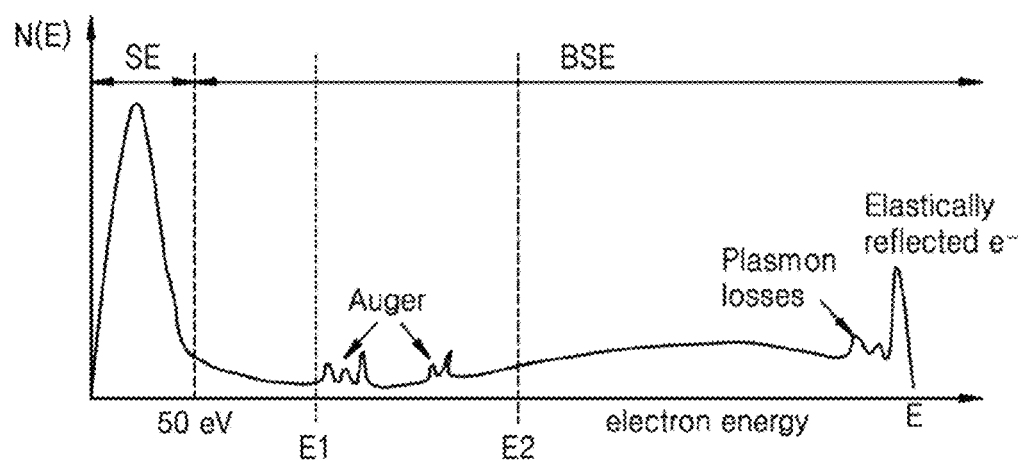
FIG. 3 is a graph illustrating an operation of the SEM according to some example embodiments.

According to some example embodiments, the first energy E1 (refer to FIG. 3) may be different from the second energy E2 (refer to FIG. 3). According to some example embodiments, the first energy E1 (refer to FIG. 3) may be less than the second energy E2 (refer to FIG. 3).

According to some example embodiments, the first detector 55 may detect some of the emission electrons EE (e.g., a first portion of the emission electrons EE emitted from the wafer W) passing through the first energy filter 53. According to some example embodiments, energy of the emission electrons EE detected by the first detector 55 (e.g., energy of the first portion of the emission electrons EE detected by the first detector 55) may be greater than or equal to the first energy E1 (refer to FIG. 3). For example, the first energy filter 53 may be configured to block electrons having energy less than the first energy among the emission electrons EE from being detected by the first detector 55. Restated, the first energy filter 53 may be configured to selectively transmit, to the first detector 55, electrons having energy that is greater than or equal to the first energy E1 as the first portion of emission electrodes EE detected by the first detector 55.

According to some example embodiments, the second detector 56 may detect some of the emission electrons EE (e.g., a second portion of the emission electrons EE emitted from the wafer W) passing through the second energy filter 54. According to some example embodiments, energy of the emission electrons EE detected by the second detector 56 (e.g., energy of the second portion of the emission electrons EE detected by the second detector 56) may be greater than or equal to the second energy E2 (refer to FIG. 3). For example, the second energy filter 54 may be configured to block electrons having energy less than the second energy among the emission electrons EE from being detected by the second detector 56. Restated, the second energy filter 54 may be configured to selectively transmit, to the second detector 56, electrons having energy that is greater than or equal to the second energy E2 as the second portion of emission electrodes EE detected by the first detector 55.

The stage 60 may support the wafer W to be measured. The stage 60 may move the wafer W in horizontal and vertical directions or may rotate the wafer W by using the vertical direction as an axis so that the wafer W is aligned with respect to an optical system (that is, an optical system including the electron gun 10, the focusing lens 20, the deflector 30, and the objective lens 40) transmitting the input electron beam IEB.

The processor 70 may process a first image generated by the first detector 55 and a second image generated by the second detector 56. The processor 70 may perform a differential operation (e.g., a first differential operation) on the first image generated by the first detector 55 and the second image generated by the second detector 56. A differential operation as performed may include taking a difference between corresponding pixel values of the first image and the second image. The processor 70 may obtain a differential image of the wafer W based on the first image generated by the first detector 55 and the second image generated by the second detector 56. Obtaining a differential image in any example embodiments may be based on performing a differential operation on the first and second images Accordingly, the processor 70 may be configured to generate an image (e.g., differential image) of the wafer W based on the first image and the second image. The differential image may be an image of the wafer W that is based on emission electrons having energy that is between the first energy E1 and the second energy E2, where such emission electrons may be referred to as a third portion of the emission electrons EE having energy between the first energy E1 and the second energy E1. In some example embodiments, the third portion of the emission electrons EE may include a portion of the first and second portions of the emission electrons EE which have energy between the first energy E1 and the second energy E2.

According to some example embodiments, the SEM 1 may further include a controller controlling optical elements included in the SEM 1. The controller may generate a signal for controlling oscillation of the electron gun 10, operations of the focusing lens 20, operations of the deflector 30, operations of the objective lens 40, operations of the first and second power sources 51 and 52, operations of the first and second energy filters 53 and 54, and/or operations of the first and second detectors 55 and 56.

Each of the controller and the processor 70 may include a computing device such as a workstation computer, a desktop computer, a laptop computer, or a tablet computer. The controller and the processor 70 may include separate hardware components or separate software components included in one hardware component. Each of the controller and the processor 70 may be implemented by a simple controller, a microprocessor, a complicated processor such as a central processing unit (CPU) or a graphics processing unit (GPU), a processor including software, dedicated hardware, or firmware. Each of the controller and the processor 70 may be implemented by, for example, a general purpose computer or application specific hardware such as a digital signal processor (DSP), a field programmable gate array (FPGA), or an application specific integrated circuit (ASIC).

As described herein, any devices, systems, blocks, modules, units, controllers, processors, circuits, apparatus, and/or portions thereof according to any of the example embodiments (including, without limitation, any of the example embodiments of the SEM 1, the SEM 2, the SEM 3, the processor 70, the controller, any portion thereof, or the like) may include, may be included in, and/or may be implemented by one or more instances of processing circuitry such as hardware including logic circuits; a hardware/ software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, processors, controllers, circuits, apparatuses, and/or portions thereof according to any of some example embodiments, and/or any portions thereof, including for example some or all operations of any of the methods shown in FIGS. 2, 8, 9, 10, 11A-11F, or any combination thereof.

According to some example embodiments, operations of the controller and the processor 70 may be implemented as instructions stored on a computer-readable medium that may be read and executed by one or more instances of processing circuitry. Here, the computer-readable medium may include an arbitrary mechanism for storing and/or transmitting information to be read by a machine (for example, a computing device, processing circuitry, etc.). For example, the computer-readable medium may include read only memory (ROM), random access memory (RAM), a magnetic disk storage medium, an optical storage medium, flash memory devices, or a memory device using an electrical, optical, acoustic or another type of radio signal (for example, a carrier, an infrared signal, or a digital signal), or an arbitrary signal.

The controller and the processor 70 may include firmware, software, routines, and instructions for performing the described operation or an arbitrary process described hereinafter on the controller and the processor 70. However, the operations of the controller and the processor 70 may be executed by a computing device, a processor, a controller, or another device executing firmware, software, routines, or a command (e.g., one or more instances of processing circuitry).

Figure 2:
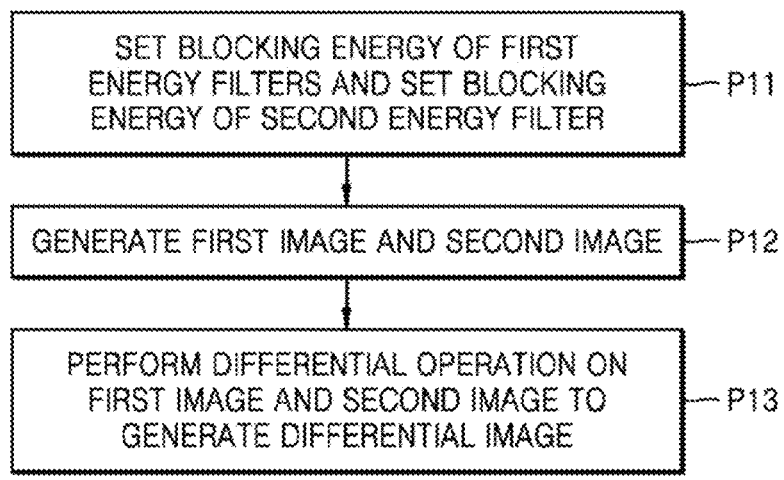
FIG. 2 is a flowchart illustrating an operation of the SEM according to some example embodiments.

FIG. 2 is a flowchart illustrating an operation of the SEM 1 according to some example embodiments. The method shown in FIG. 2 may be at least partially performed based on operation of one or more instances of processing circuitry to control the SEM 1 and/or any portions thereof (e.g., based on processing circuitry implementing the processor 70 of SEM 1 executing a program of instructions to generate control signals to control one or more portions of the SEM 1), according to some example embodiments.

FIG. 3 is a graph illustrating an operation of the SEM 1 according to some example embodiments. More specifically, FIG. 3 is a characteristic curve illustrating electron density-energy distribution of the emission electrons EE detected by the SEM 1.

Referring to FIGS. 1 to 3, the first energy filter 53 and the second energy filter 54 may be set in P11.

Setting of the first energy filter 53 may include adjusting of power transmitted by the first power source 51 so that the blocking energy of the first energy filter 53 becomes the first energy E1. Setting of the second energy filter 54 may include adjusting of power transmitted by the second power source 52 so that the blocking energy of the second energy filter 54 becomes the second energy E2.

Then, by the SEM 1 performing measurement in P12, the first image may be generated by the first detector 55 and the second image may be generated by the second detector 56.

The first image may be generated by electrons having energy greater than or equal to the first energy E1 among the emission electrons EE. The second image may be generated by electrons having energy greater than or equal to the second energy E2 among the emission electrons EE.

Then, the differential operation (e.g., a first differential operation) may be performed on the first image and the second image to generate the differential image in P13.

The differential image may be generated by the differential operation between the first image and the second image. The differential image may be generated by electrons having energy greater than or equal to the first energy E1 and less than or equal to the second energy E2 among the emission electrons EE.

The differential image may be an image of the wafer W that is based on emission electrons having energy that is between the first energy E1 and the second energy E2, where such emission electrons may be referred to as a third portion of the emission electrons EE having energy between the first energy E1 and the second energy E1. In some example embodiments, the third portion of the emission electrons EE may include a portion of the first and second portions of the emission electrons EE which have energy between the first energy E1 and the second energy E2.

As described herein, performing a differential operation on two images, two signals, or the like may include taking a difference between corresponding portions of the two images, two signals or the like, so that a differential result (e.g., differential image, differential signal, etc.) that represents the difference is generated. For example, where the first and second images each include an array of i×j pixels, a differential operation between a first image and a second image, as described herein, may include taking a difference between pixel values (e.g., pixel intensity magnitudes) for corresponding pixels of the first and second images to generate corresponding pixels of the differential image, where the pixel value (e.g., pixel intensity magnitude) of each given pixel (i,j) of the differential image is a difference between the pixel value of the corresponding pixel (i,j) of the first image and the pixel value of the corresponding pixel (i,j) of the second image.

According to some example embodiments, one of the first image and the second image may be preprocessed to generate the differential image. According to some example embodiments, one of the first image and the second image may be standardized to generate the differential image. According to some example embodiments, the standardization of one of the first image and the second image may include controlling of a size of a signal of one of the first image and the second image so that a signal of the first image (e.g., first signal) having a band greater than or equal to the second energy E2 is the same as a signal of the second image (e.g., second signal) having a band greater than or equal to the second energy E2.

As illustrated in FIG. 3, the second energy E2 may be greater than the first energy E1. The backscattered electrons, the Auger electrons, and elastically reflected electrons may be included in an energy band greater than or equal to the first energy E1. The backscattered electrons and the elastically reflected electrons may be included in the energy band greater than or equal to f the first energy E1.

In FIG. 3, the first energy E1 is greater than the energy of the Auger electrons and the second energy E2 is less than the energy of the Auger electrons so that the differential image includes a signal generated by the backscattered electrons including the Auger electrons. However, the inventive concepts is not limited thereto. For example, each of the first energy E1 and the second energy E2 may have energy with a band greater or less than that of the energy of the Auger electrons.

According to some example embodiments, each of the first energy E1 and the second energy E2 may be determined so that each of the first energy filter 53 and the second energy filter 54 blocks secondary electrons generated near the surface of the wafer W. As a non-limiting example, each of the first energy E1 and the second energy E2 may be greater than or equal to about 50 eV.

Figure 4A:
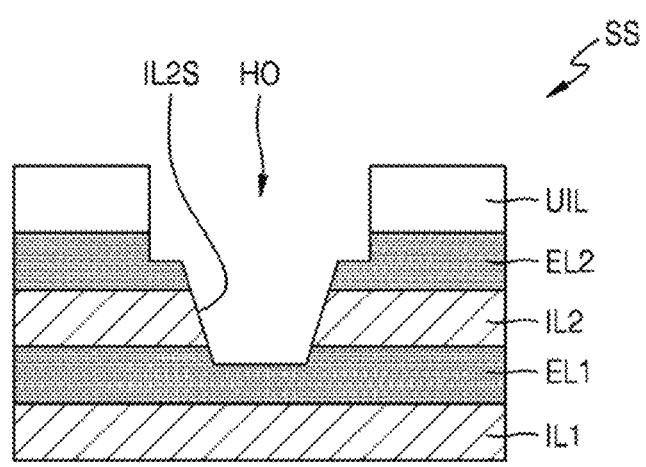
FIGS. 4A, 4B, and 4C are views illustrating the effects of the SEM according to some example embodiments.
Figure 4B:
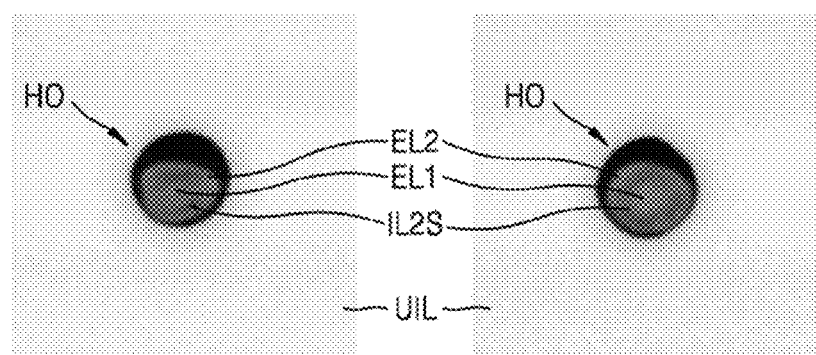
Figure 4C:
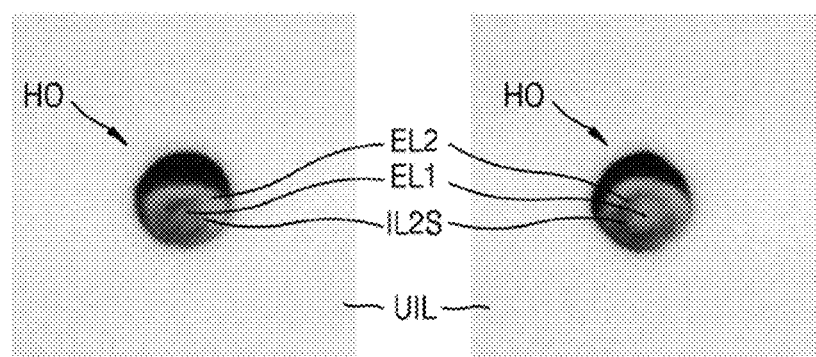

FIGS. 4A, 4B, and 4C are views illustrating the effects of the SEM 1 according to some example embodiments.

More specifically, FIG. 4A illustrates a cross-section of a stack structure SS in which a contact hole HO is formed, FIG. 4B illustrates an image in a stack structure SS measured by a conventional SEM, and FIG. 4C illustrates a differential image in a stack structure SS generated by the SEM 1 according to some example embodiments.

Referring to FIGS. 1 and 4A to 4C, the stack structure SS may be formed on the wafer W of FIG. 1 and may include a first insulating layer IL1, a first electrode layer EL1, a second insulating layer IL2, a second electrode layer EL2, and an upper insulating layer UIL that are sequentially stacked.

The first and second electrode layers EL1 and EL2 may include, for example, a conductive material such as tungsten (W). The first and second insulating layers IL1 and IL2 and the upper insulating layer UIL may include, for example, a non-conductive material such as silicon oxide, silicon nitride, and silicon oxynitride.

The contact hole HO is formed in the stack structure SS to reach the second electrode layer EL2. However, a top surface of the first electrode layer EL1 is exposed by the contact hole HO due to excessive etching. Due to the excessive etching, a slope IL2S defining a lower portion of the contact hole HO may be formed in the second insulating layer IL2. Therefore, when the conductive material is deposited on the contact hole HO, failure may occur due to a short between the first electrode layer EL1 and the second electrode layer EL2.

It is noted from FIGS. 4B and 4C that contrast to the slope IL2S of the SEM 1 according to some example embodiments is greater than contrast to the slope IL2S of the conventional SEM. This is because electrons having high energy greater than or equal to the second energy E2 (refer to FIG. 3) include a large number of electrons from underlying layers (that is, the first electrode layer EL1 and the first insulating layer IL1) of a layer to be measured.

According to some example embodiments, by generating the differential image that is an image for (e.g., an image based on) electrons in an energy band between the first energy E1 (refer to FIG. 3) and the second energy E2 (refer to FIG. 3), sensitivity to electrons from a structure (for example, the slope IL2S of the second insulating layer IL2) having an intermediate depth from a surface of the stack structure SS may be improved. Therefore, the SEM 1 with improved sensitivity to process defects may be provided.

In some example embodiments, a differential image may be processed to determine that an imaged contact hole OH in the image is excessively etched. For example, the imaged contact hole OH in the differential image may be analyzed to determine whether a ring pattern, indicating a slope IL2S between electrode layers EL1 and EL2, is present in the imaged contact hole OH, where such a ring pattern is indicative of the excessive etching as described above. As described above, the differential image provides improved contrast of the slope IL2S between the electrode layers EL1 and EL2, thereby improving likelihood of detection of the excessive etching in a contact hole OH. For example, the slope IL2S between exposed electrode layers EL1 and EL2 may be identified based on processing the pixel values (e.g., pixel intensity magnitudes) of the differential image of the contact hole OH (e.g., as shown in FIG. 4C) to determine that a darker "ring" pattern is present in the contact hole OH between central, lighter pixels (indicating exposed electrode layer EL1) and outer, lighter pixels (indicating exposed electrode layer EL2). Where such a "ring" pattern is absent, the contact hole OH may be determined to be not excessively etched.

As a result, a computing device (e.g., processing circuitry as described herein) may execute a program of instructions to process the differential image to determine whether a contact hole OH in an imaged device (e.g., wafer W, stack structure SS, etc.) is excessively etched. Based on a determination of whether at least one contact hole OH in an imaged device is excessively etched, the computing device may selectively manipulate the device, for example control one or more devices to cause the imaged device to be selectively directed to a further manufacturing operation to manufacture a semiconductor device the contact holes OH in the differential image are determined to be not excessively etched or to cause the imaged device to be selectively directed to a refurbishment, repair, and/or discarding operation if at least one excessively etched contact hole OH is determined to be present in the differential image.

Based on an SEM according to any of the example embodiments having the structure and configuration as described with regard to some example embodiments (e.g., including at least one detector and at least one energy filter), and thus configured to generate an image based on the first and second images and which may be based on electrons having energy between the first energy and the second energy (e.g., a differential image) as described according to any of the example embodiments, the SEM may be configured to generate an image (e.g., differential image) having improved sensitivity to intermediate structures in an imaged contact hole OH and may thus have improved ability to generate images reliably imaging a process defect indicating excessive etching of the contact hole OH. Accordingly, the SEM according to some example embodiments may have improved sensitivity to process defects of excessive etching of contact holes OH, and the reliability and performance of the SEM with regard to generating images that reliably highlight process defects of excessive etching of contact holes OH may be improved. Accordingly, the functionality of the SEM to enable detection of process defects regarding excessive etching of a contact hole OH that exposes two electrode layers (e.g., EL1/EL2) may be improved.

Furthermore, the functionality of a manufacturing system that selectively processes/forwards the devices being imaged by an SEM according to some example embodiments may be improved based on the SEM being improved to generate images having improved sensitivity to such process defects. Based on the differential image providing improved contrast and thus visibility of the slope IL2S of the contact hole OH, based on the differential image being generated by any of the SEMs according to any of the example embodiments, via any of the methods of any of the example embodiments, the reliability of the determination of an excessively etched contact hole OH may be improved, and thus the likelihood of devices (e.g., wafers) having excessively etched process holes being included in manufactured devices may be reduced, thereby improving the overall reliability of the manufactured devices.

In some example embodiments, based on measuring a wafer W having exposed contact holes OH based on generating a differential image of the wafer W using any of the SEMs according to any of the example embodiments, according to any of the methods shown in FIGS. 2 and 7-9, images (e.g., differential images) having improved contrast between the slope ILS2 and adjacent electrode layers (e.g., EL1/EL2) may enable improved reliability in identifying contact holes (e.g., OH) that are excessively etched. Wafers having contact holes OH that are determined to have excessive etching based on processing/analyzing a differential image generated by any of the SEMs according to any of the example embodiments, based on performing any of the methods for inspecting the wafers according to any of the example embodiments, may be selectively discarded or directed to refurbishment/repair or may be selectively passed to further operations to manufacture a semiconductor device using the imaged wafer. Due to the improved sensitivity of the image to the slope ILS2 as described above, the image may provide improved ability to detect the process defect of the over-etched contact holes with improved reliability, thereby enabling wafers having such process defects to be identified more reliably and precluded from being included in a fully-manufactured semiconductor device, thereby enabling manufactured semiconductor devices and electronic devices including same to have improved reliability and thus improved performance of both the manufacturing process and the manufactured semiconductor devices and electronic devices.

Figure 5:
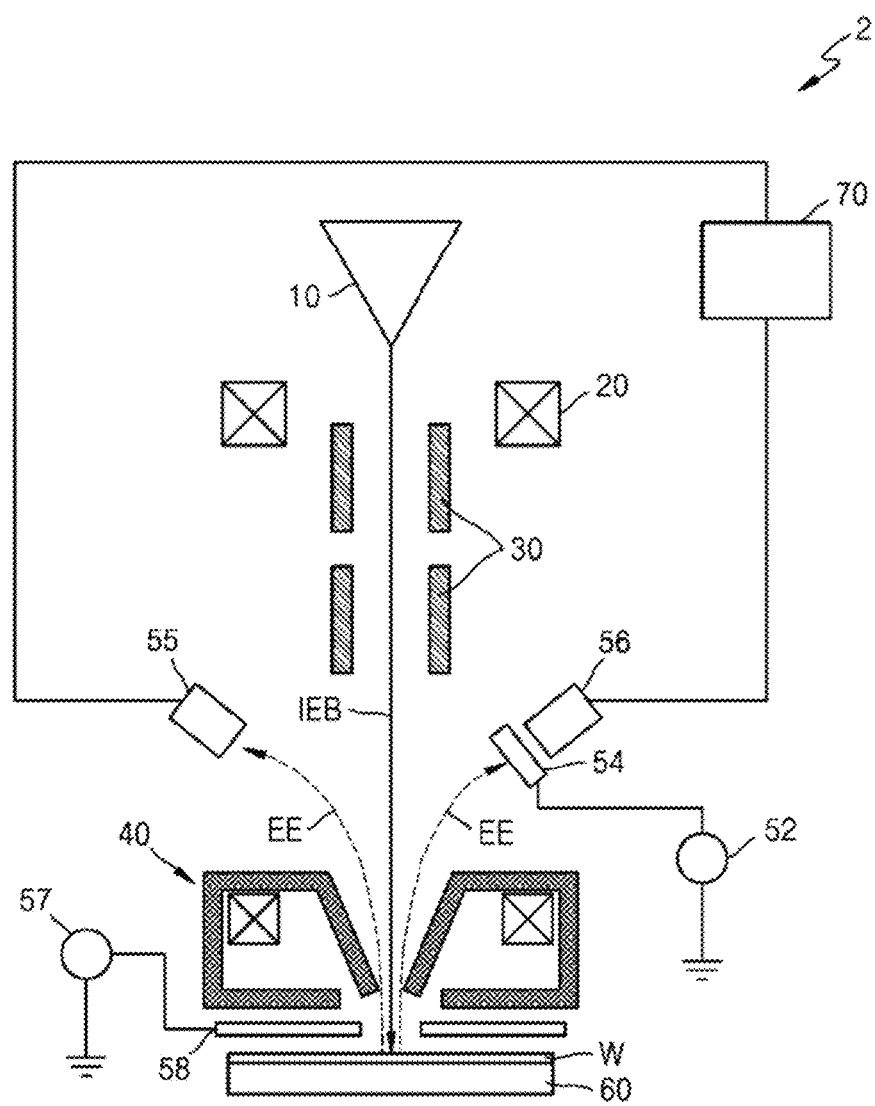
FIG. 5 is a view illustrating an SEM according to some example embodiments.

FIG. 5 is a view illustrating an SEM 2 according to some example embodiments.

Referring to FIG. 5, the SEM 2 may include an electron gun 10, a focusing lens 20, a deflector 30, an objective lens 40, a first power source 57, a second power source 52, a first energy filter 58, a second energy filter 54, a first detector 55, a second detector 56, a stage 60, and a processor 70.

Because the electron gun 10, the focusing lens 20, the deflector 30, the objective lens 40, the second power source 52, the second energy filter 54, the first detector 55, the second detector 56, the stage 60, and the processor 70 are the same as described with reference to FIG. 1, descriptions thereof are omitted.

According to some example embodiments, the first power source 57 may supply power for biasing the emission electrons EE to the first energy filter 58. According to some example embodiments, the first energy filter 58 may include high pass filters. According to some example embodiments, the first energy filter 58 may block electrons having energy less than the first energy E1 (refer to FIG. 3) among the emission electrons EE.

According to some example embodiments, the first energy filter 58 may be arranged on the path of the input electron beam IEB between the objective lens 40 and a wafer W. According to some example embodiments, the first energy filter 58 may be between the objective lens 40 and the stage 60. According to some example embodiments, the first energy filter 58 may apply an electric potential to the wafer W so as to emit induced charges to the wafer W by an operation of the SEM 2 in addition to blocking some of the emission electrons EE. According to some example embodiments, the first energy filter 58 may neutralize the wafer W so that the reliability of measurement of the SEM 2 may be improved.

Figure 6:
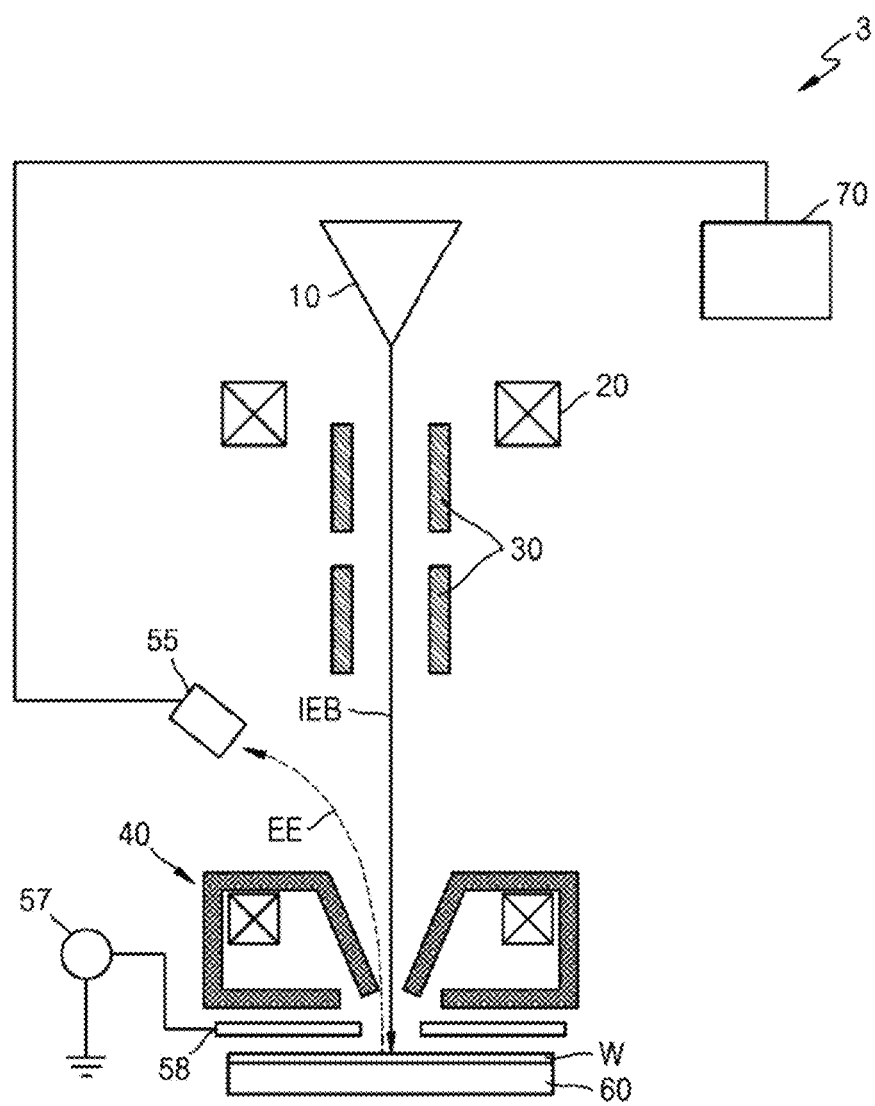
FIG. 6 is a view illustrating an SEM according to some example embodiments.

FIG. 6 is a view illustrating an SEM 3 according to some example embodiments.

Referring to FIGS. 3 and 6, the SEM 3 may include an electron gun 10, a focusing lens 20, a deflector 30, an objective lens 40, a first power source 57, a first energy filter 58, a first detector 55, a stage 60, and a processor 70.

Because the electron gun 10, the focusing lens 20, the deflector 30, the objective lens 40, the first detector 55, the stage 60, and the processor 70 are the same as described with reference to FIG. 1, descriptions thereof are omitted. Because the first power source 57 and the first energy filter 58 are the same as described with reference to FIG. 5 except for the operation method of thereof, redundant descriptions will be omitted.

According to some example embodiments, the first power source 57 may control power supplied to the first energy filter 58 so that blocking energy of the first energy filter 58 becomes one of the first energy E1 and the second energy E2. According to some example embodiments, by measuring the wafer W while controlling the blocking energy of the first energy filter 58, a differential image of the wafer W of electrons having energy greater than or equal to the first energy E1 and less than or equal to the second energy E2 among the emission electrons EE may be generated.

Hereinafter, referring to FIGS. 7 to 9, an operation of the SEM 3 will be described in more detail.

Figure 7:
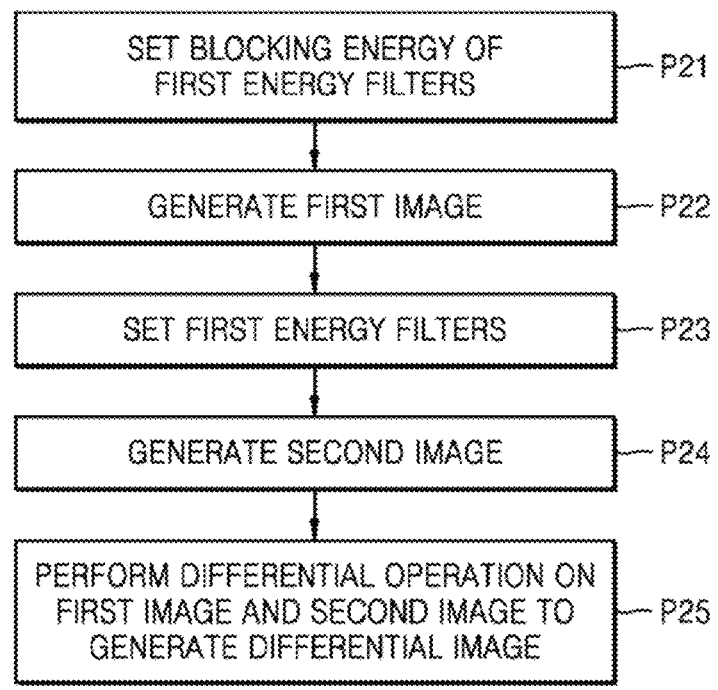
FIGS. 7, 8, and 9 are flowcharts each illustrating a method of operating an SEM, according to some example embodiments.

FIG. 7 is a flowchart illustrating a method of operating the SEM 3, according to some example embodiments. The method shown in FIG. 7 may be at least partially performed based on operation of one or more instances of processing circuitry to control the SEM 3 and/or any portions thereof (e.g., based on processing circuitry implementing the processor 70 of SEM 3 executing a program of instructions to generate control signals to control one or more portions of the SEM 3), according to some example embodiments.

Referring to FIGS. 3, 6, and 7, the blocking energy of the first energy filter 58 may be set as the first energy E1 in P21.

Then, in P22, by measuring the wafer W, a first image of the wafer W may be obtained.

Then, in P23, the blocking energy of the first energy filter 58 may be set as the second energy E2.

Then, in P24, by measuring the wafer W, a second image of the wafer W may be obtained.

Then, in P25, a differential operation (e.g., a first differential operation) is performed on the first image and the second image so that the differential image of the wafer W may be generated. According to some example embodiments, because the first image and the second image are obtained at different times, the first image may not be the same as the second image. For example, the first image and the second image may be in different portions on the wafer W.

According to some example embodiments, the differential operation performed on the first image and the second image may further include aligning the first image with the second image based on a pattern included in the first image and the second image. Aligning the first image with the second image may include moving one of the first image and the second image in parallel so that pixels for a first pattern included in the first image are in the same position as pixels for a second pattern included in the second image. According to some example embodiments, in addition to aligning the first image with the second image, one of the first image and the second image may be enlarged, reduced, and rotated.

According to some example embodiments, the differential operation on the first image and the second image may be performed by a differential operation on a signal value (e.g., signal magnitude) of each of the pixels of the first image and a signal value of corresponding (or identical) one of the pixels of the second image.

Figure 8:
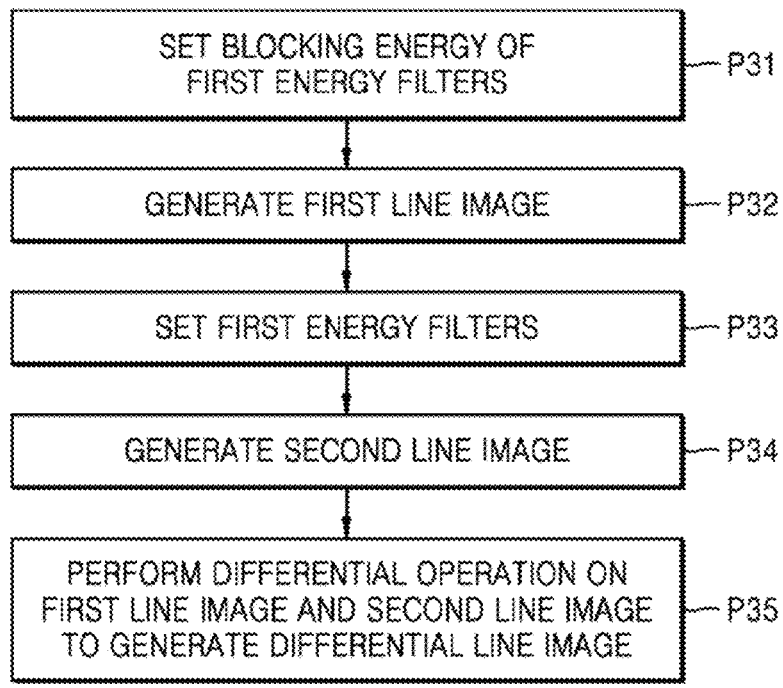

FIG. 8 is a flowchart illustrating a method of operating the SEM 3, according to some example embodiments. The method shown in FIG. 8 may be at least partially performed based on operation of one or more instances of processing circuitry to control the SEM 3 and/or any portions thereof (e.g., based on processing circuitry implementing the processor 70 of SEM 3 executing a program of instructions to generate control signals to control one or more portions of the SEM 3), according to some example embodiments.

Referring to FIGS. 3, 6, and 8, the blocking energy of the first energy filter 58 may be set as the first energy E1 in P31.

Then, in P32, by measuring the wafer W, a first line image of the wafer W may be obtained. The first line image may be generated by scanning the input electron beam IEB onto the wafer W in a first direction horizontal to a top surface of the wafer W. According to some example embodiments, the first line image may include only one pixel in a second direction. Therefore, a length of the first line image in the first direction may be greater than a length of the first line image in the second direction.

Then, in P33, the blocking energy of the first energy filter 58 may be set as the second energy E2.

Then, in P34, by measuring the wafer W, a second line image of the wafer W may be obtained. The second line image may be generated by scanning the input electron beam IEB onto the wafer W in the first direction horizontal to the top surface of the wafer W. According to some example embodiments, the second line image may include only one pixel in the second direction. Therefore, a length of the second line image in the first direction may be greater than a length of the second line image in the second direction. According to some example embodiments, the second line image may be intended to be generated by measuring the same portion on the wafer W.

Then, in P35, a differential operation (e.g., a first differential operation) is performed on the first image and the second image so that the differential image of the wafer W may be generated. According to some example embodiments, because the first line image and the second line image are obtained at different times, a position in which the first line image is captured may not be the same as a position in which the second line image is captured. For example, the first line image and the second line image may be in different portions on the wafer W.

According to some example embodiments, the differential operation performed on the first line image and the second line image may further include aligning the first line image with the second line image based on a pattern included in the first line image and the second line image. Aligning the first line image with the second line image may include moving one of the first line image and the second line image in parallel so that pixels for a first pattern included in the first line image are in the same position as pixels for a second pattern included in the second line image.

According to some example embodiments, the differential operation on the first line image and the second line image may be performed by a differential operation on a signal value of each of the pixels of the first line image and a signal value of corresponding (or, identical) one of the pixels of the second line image.

Then, a differential line image of a subsequent row may be obtained by repeatedly performing P31 to P35 after moving a position in which the input electron beam IEB is irradiated by one pixel in the second direction. As described above, by generating differential line images of a plurality of rows and combining them with one another, a differential image may be generated.

As a non-limiting example, the generation of a differential line image including only one pixel in the second direction is described. However, those skilled in the art may easily generate a differential line image including two or more pixels in the second direction and a larger number of pixels in the first direction based on description given here.

Figure 9:
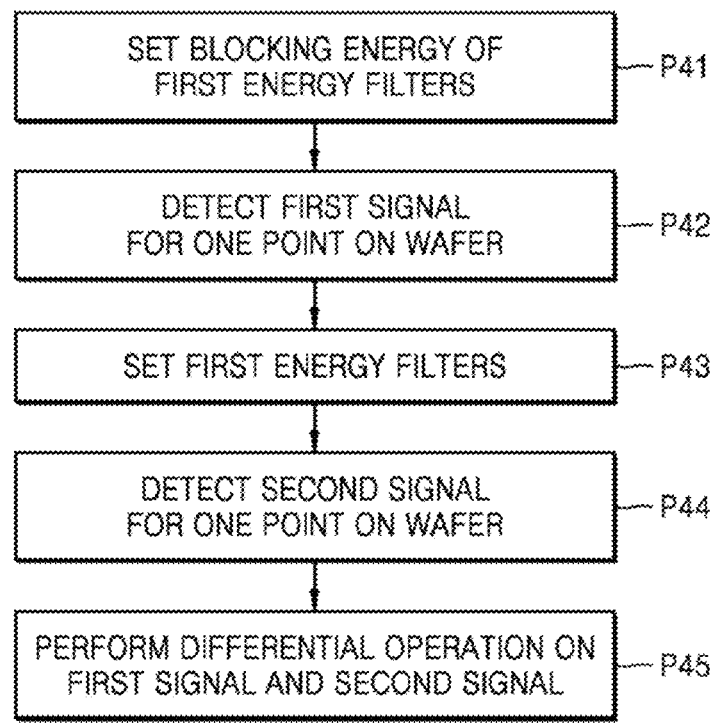

FIG. 9 is a flowchart illustrating a method of operating the SEM 3, according to some example embodiments. The method shown in FIG. 9 may be at least partially performed based on operation of one or more instances of processing circuitry to control the SEM 3 and/or any portions thereof (e.g., based on processing circuitry implementing the processor 70 of SEM 3 executing a program of instructions to generate control signals to control one or more portions of the SEM 3), according to some example embodiments.

Referring to FIGS. 3, 6, and 9, the blocking energy of the first energy filter 58 may be set as the first energy E1 in P41.

Then, in P42, by measuring the wafer W and sensing the emission electrons EE from a first point on the wafer W, a first signal may be obtained.

Then, in P43, the blocking energy of the first energy filter 58 may be set as the second energy E2.

Then, in P44, by measuring the wafer W and sensing the emission electrons EE from the first point on the wafer W, a second signal may be obtained.

Then, a differential operation (e.g., a first differential operation) may be performed on the first signal and the second signal in P45. A differential signal may be generated by the differential operation performed on the first signal and the second signal. The first signal and the second signal are for the first point on the wafer W, and the differential signal may be a value of one pixel of the differential image. In the current example, by repeatedly performing P41 to P45 on a plurality of positions on the wafer W, the differential image of the wafer W may be generated.

Figure 10:
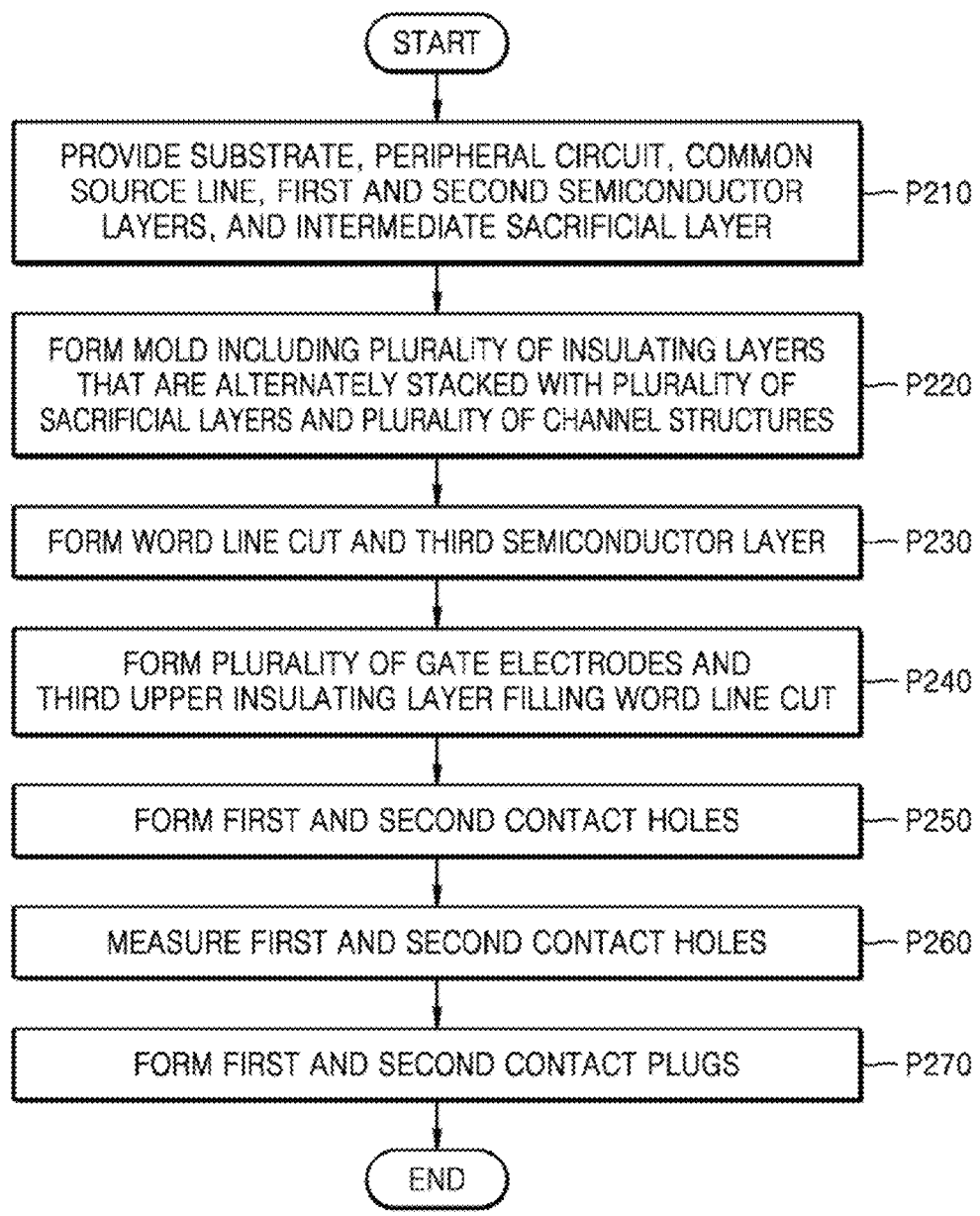
FIG. 10 is a flowchart illustrating a method of manufacturing a semiconductor device, according to some example embodiments.

FIG. 10 is a flowchart illustrating a method of manufacturing a semiconductor device, according to some example embodiments. The method shown in FIG. 10 may be at least partially performed based on operation of one or more instances of processing circuitry to control one or more devices and/or any portions thereof (e.g., based on executing a program of instructions to generate control signals to control one or more semiconductor device manufacturing devices), according to some example embodiments.

FIGS. 11A, 11B, 11C, 11D, 11E, and 11F are cross-sectional views illustrating a method of manufacturing a semiconductor device, according to some example embodiments. The method shown in FIGS. 1A to 11E may be at least partially performed based on operation of one or more instances of processing circuitry to control one or more devices and/or any portions thereof (e.g., based on executing a program of instructions to generate control signals to control one or more semiconductor device manufacturing devices), according to some example embodiments.

Figure 11A:
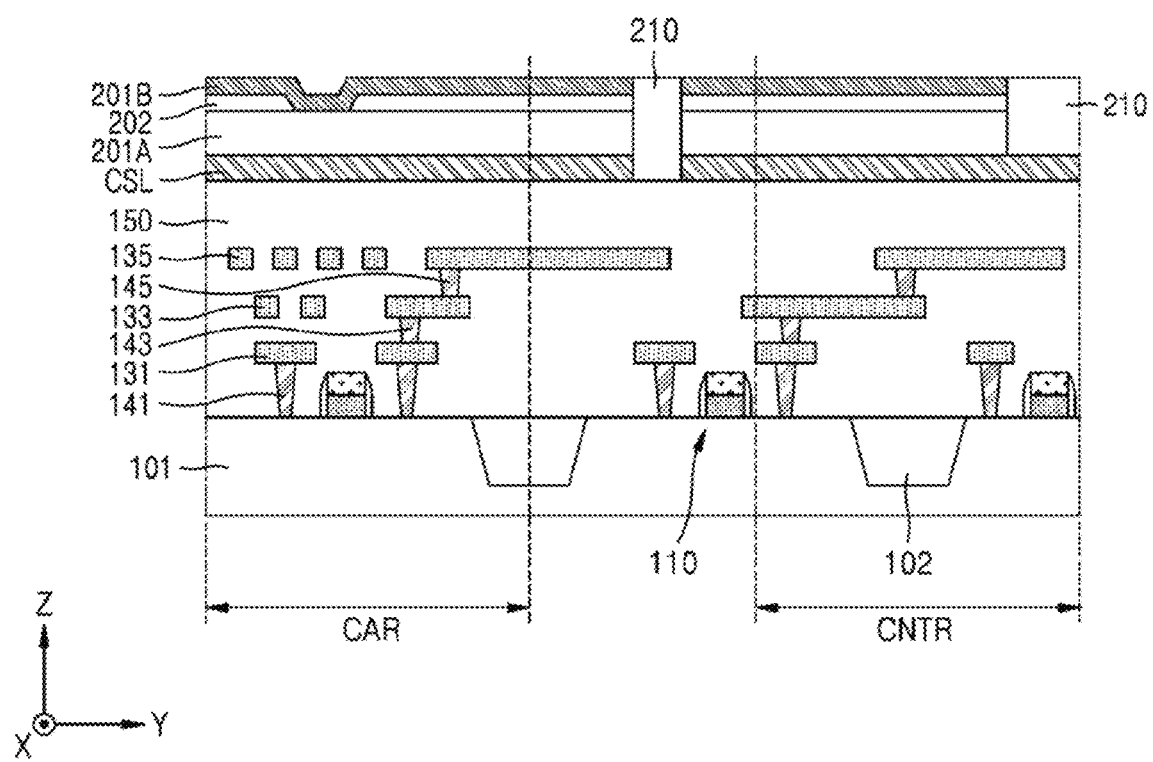
FIGS. 11A, 11B, 11C, 11D, 11E, and 11F are cross-sectional views illustrating a method of manufacturing a semiconductor device, according to some example embodiments.

Referring to FIGS. 10 and 11A, in P210, a substrate 101, a peripheral circuit, a common source line plate CSL, first and second semiconductor layers 201A and 201B, and an intermediate sacrificial layer 202 may be provided.

A cell array region CAR, in which memory cells are formed, and a contact region CNTR for contacting a cell gate electrode may be defined on the substrate 101. The cell array region CAR may substantially have a rectangular layout, and the contact region CNTR may be positioned at one end or both ends of the cell array region CAR.

Here, a direction perpendicular to a top surface of the substrate 101 is defined as a Z direction and two directions parallel with the top surface of the substrate 101 and perpendicular to each other are respectively defined as an X direction and a Y direction.

Processes of forming the peripheral circuit may include a process of forming a device isolation layer 102 in the substrate 101, an ion implantation process of forming a p-well region and an n-well region in the substrate 101, a process of forming peripheral transistors 110, and a metal wiring process of forming a peripheral circuit wiring line.

According to some example embodiments, the substrate 101 may include a semiconductor material such as single crystal silicon (Si) or single crystal germanium (Ge). Trenches defining an active region and an inactive region may be formed in the substrate 101, and the device isolation layer 102 filling the trenches may be formed.

In the metal wiring process, by patterning a conductive material and providing an insulating material, a plurality of peripheral conductive patterns 131, 133, and 135 at different levels and peripheral conductive vias 141, 143, and 145 connecting the plurality of peripheral conductive patterns 131, 133, and 135 at different levels to one another are formed. As a result, the peripheral transistors 110 may be connected to memory cells.

The intermediate sacrificial layer 202 including an insulating material may be provided on the first semiconductor layer 201A. According to some example embodiments, the intermediate sacrificial layer 202 may include one of silicon oxide, silicon nitride, and silicon oxynitride. According to some example embodiments, the intermediate sacrificial layer 202 may have high etching selectivity for insulating layers 220 (refer to FIG. 11B) described below.

Then, after patterning the intermediate sacrificial layer 202 to remove a part of the intermediate sacrificial layer 202, the second semiconductor layer 201B may be conformally provided. As a result, the first semiconductor layer 201A may contact the second semiconductor layer 201B in a portion in which the intermediate sacrificial layer 202 is removed.

Then, an intermediate insulating layer 210 may be formed. Processes of forming the intermediate insulating layer 210 may include a process of etching the common source line plate CSL, the first semiconductor layer 201A, the intermediate sacrificial layer 202, and the second semiconductor layer 201B so that a top surface of a lower insulating layer 150 is exposed and a process of sufficiently providing an insulating material so as to fill an opening formed by performing the etching process and performing planarization so that a top surface of the second semiconductor layer 201B is exposed. According to some example embodiments, the intermediate insulating layer 210 may include silicon oxide, silicon nitride, or silicon oxynitride. However, the inventive concepts is not limited thereto.

Figure 11B:
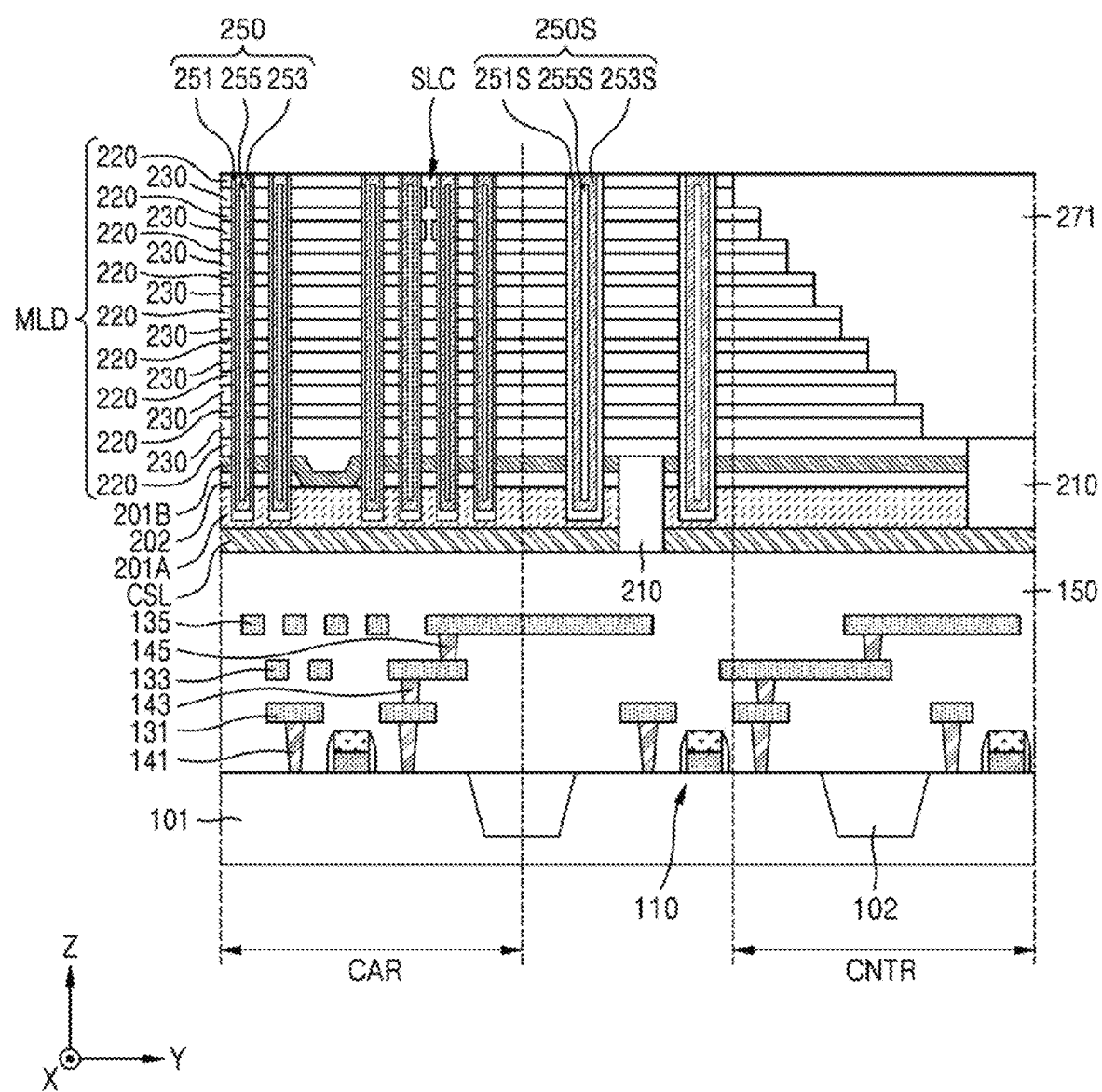

Referring to FIGS. 10 and 11B, in P220, a mold MLD including the insulating layers 220 and sacrificial layers 230 that are alternately stacked and channel structures 250 and support structures 250S may be formed.

The mold MLD may include the insulating layers 220 and the sacrificial layers 230 that are alternately stacked with each other. According to some example embodiments, the insulating layers 220 and the sacrificial layers 230 may include different materials. According to some example embodiments, the insulating layers 220 may have high etching selectivity for the sacrificial layers 230.

For example, when the insulating layers 220 include silicon oxide, the sacrificial layers 230 may include undoped polysilicon or silicon nitride. In another example, when the insulating layers 220 include silicon nitride, the sacrificial layers 230 may include undoped polysilicon or silicon oxide. For example, when the insulating layers 220 include undoped polysilicon, the sacrificial layers 230 may include silicon nitride or silicon oxide.

The insulating layers 220 and the sacrificial layers 230 included in the mold MLD may configure a stair structure on the contact region CNTR. In the stair structure, the sacrificial layers 230 closer to the substrate 101 horizontally protrude more than the sacrificial layers 230 far from the substrate 101 and the insulating layers 220 closer to the substrate 101 horizontally protrude more than the insulating layers 220 far from the substrate 101.

According to some example embodiments, a string selection line cut SLC for horizontally separating the uppermost sacrificial layer 230 from the second uppermost sacrificial layer 230 may be formed and a space recessed by forming the string selection line cut SLC may be filled with an insulating material.

According to some example embodiments, a first upper insulating layer 271 for covering the stair structure of the mold MLD may be formed. The first upper insulating layer 271 may include an insulating material.

Then, after providing a photoresist layer and a hard mask layer on the mold MLD through a lithography process, a plurality of holes may be formed by using the photoresist layer and the hard mask layer as etching masks. The plurality of holes may extend to in the Z direction. Then, by sequentially providing a gate insulating material layer, a channel material layer, and a buried insulating material layer and performing an etchback process so that a top surface of the first upper insulating layer 271 is exposed, material layers filling the plurality of holes may be separated. Then, after further removing an upper portion of the buried insulating material layer in the plurality of holes, the same material as the channel material layer may be deposited. Therefore, a channel layer 253 may cover a top surface of a buried insulating layer 255 and a support channel layer 253S may cover a top surface of a support buried insulating layer 255S. Therefore, pads contacting second conductive vias 287 (refer to FIG. 11F) described below may be formed.

According to some example embodiments, a gate insulating layer 251 and a support gate insulating layer 251S may have conformal thicknesses. According to some example embodiments, the gate insulating layer 251 may configure a bottom surface and an external surface of each of the plurality of channel structures 250 and the support gate insulating layer 251S may configure a bottom surface and an external surface of each of the plurality of support structures 250S. According to some example embodiments, the gate insulating layer 251 may insulate the channel layer 253 from gate electrodes 240.

According to some example embodiments, each of the gate insulating layer 251 and the support gate insulating layer 251S may include a plurality of layers having conformal thicknesses. According to some example embodiments, each of the gate insulating layer 251 and the support gate insulating layer 251S may include a tunnel insulating layer, a charge storage layer, and a blocking insulating layer. In some cases, a barrier metal layer may be further arranged between the gate insulating layer 251 and the gate electrodes 240.

The tunnel insulating layer may include silicon oxide, hafnium oxide, aluminum oxide, zirconium oxide, or tantalum oxide. The charge storage layer may be a region in which electrons tunneled from the channel layer 253 are stored and may include silicon nitride, boron nitride, silicon boron nitride, or polysilicon doped with impurities. The blocking insulating layer may include a single layer or a stacked layer of silicon oxide, silicon nitride, hafnium oxide, aluminum oxide, zirconium oxide, and tantalum oxide. However, a material of the blocking insulating layer is not limited thereto and may include a dielectric material having a high dielectric constant.

According to some example embodiments, the channel layer 253 may fill a part of a space defined by the gate insulating layer 251. The channel layer 253 formed on an internal wall of the gate insulating layer 251 may have a conformal thickness. According to some example embodiments, an upper portion of the channel layer 253 may have a thickness greater than that of a side wall of the channel layer 253. The support channel layer 253S may also have a cross-sectional shape similar to that of the channel layer 253.

The gate insulating layer 251, the channel layer 253, and the buried insulating layer 255 may configure each of the plurality of channel structures 250, and the support gate insulating layer 251S, the support channel layer 253S, and the support buried insulating layer 255S may configure each of the plurality of support structures 250S.

According to some example embodiments, each of the plurality of channel structures 250 and the support structures 250S may be in the form of a cylinder extending in the Z direction. According to some example embodiments, each of the plurality of channel structures 250 and the support structures 250S may have a width reducing toward the substrate 101 in the Z direction.

Figure 11C:
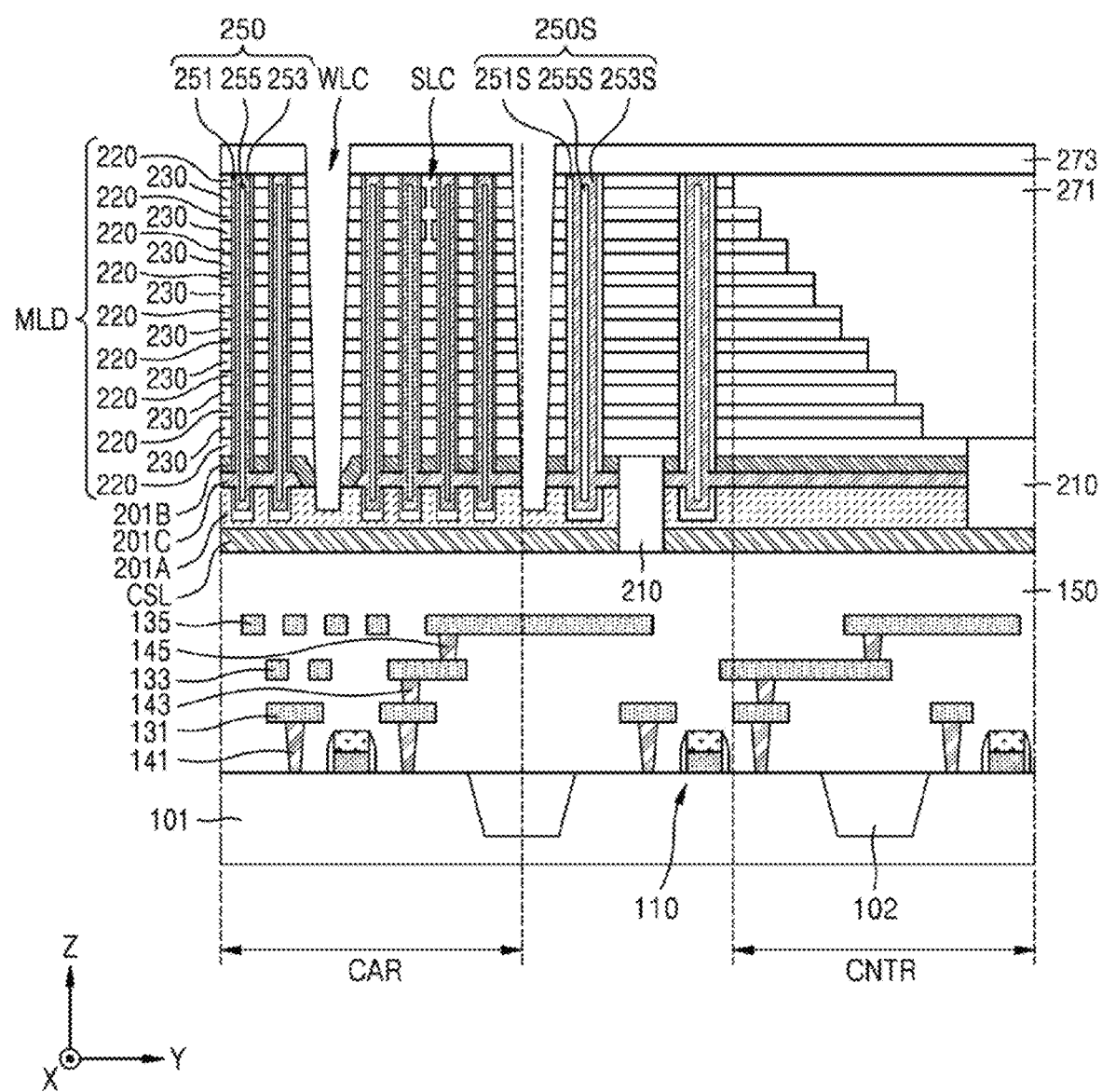

Referring to FIGS. 10 and 11C, in P230, a word line cut WLC and a third semiconductor layer 201C may be formed.

Before forming the word line cut WLC, a second upper insulating layer 273 covering the mold MLD and the first upper insulating layer 271 may be provided. The word line cut WLC may be formed by, for example, a lithography process and a dry etching process. Parts of the mold MLD may be horizontally separated from one another by forming the word line cut WLC.

In order to form the third semiconductor layer 201C, after providing a liner on the word line cut WLC, by removing a lower portion of the liner (for example, a portion at the same level as that of the intermediate sacrificial layer 202 (refer to FIG. 11B), the intermediate sacrificial layer 202 (refer to FIG. 11B) may be exposed. According to some example embodiments, the liner formed on the word line cut WLC may include a material having high etching selectivity for the intermediate sacrificial layer 202 (refer to FIG. 11B). The liner may be a layer protecting the sacrificial layers 230 on the mold MLD in a process of removing the intermediate sacrificial layer 202 (refer to FIG. 11B). Then, the intermediate sacrificial layer 202 (refer to 11B) may be removed by a wet etching process.

Even when the intermediate sacrificial layer 202 (refer to FIG. 11B) is removed, because the first semiconductor layer 201A and the second semiconductor layer 201B partially contact, the first and third semiconductor layers 201A and 201C and the mold MLD arranged thereon may be prevented from collapsing.

As described above, the third semiconductor layer 201C may be polysilicon doped with substantially the same concentration by using the same dopant as the first and second semiconductor layers 201A and 201B. Because a part of the gate insulating layer 251 is removed with the intermediate sacrificial layer 202 (refer to FIG. 11B), the third semiconductor layer 201C may contact the channel layer 253. Therefore, a charge transfer path in which the plurality of channel structures 250 may operate as a memory cell may be formed. The liner may be removed after the third semiconductor layer 201C is formed.

Figure 11D:
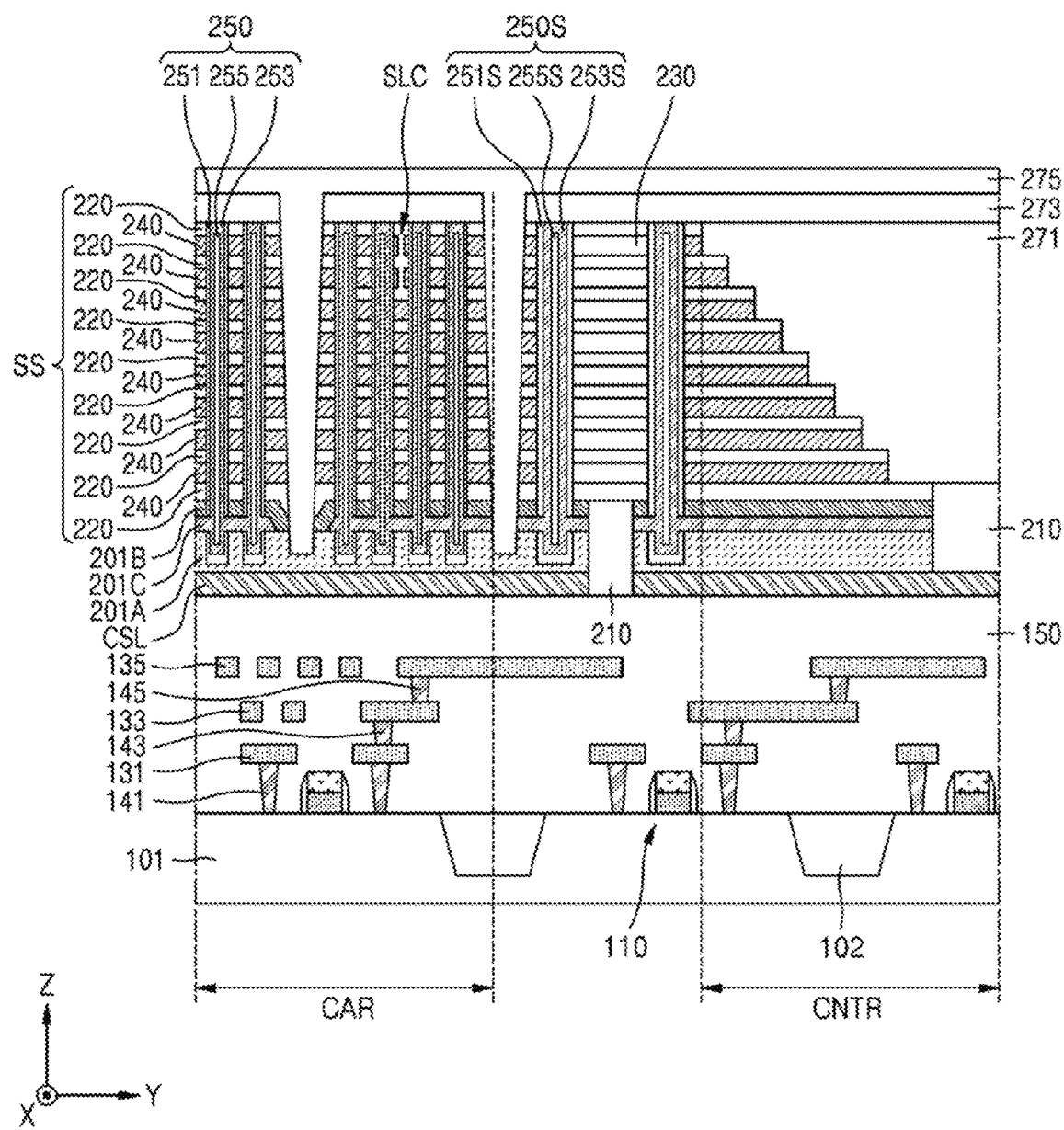

Then, referring to FIGS. 8, 11C, and 11D, in P240, the gate electrodes 240 may be formed and a third upper insulating layer 275 filling the word line cut WLC may be provided.

According to some example embodiments, because the sacrificial layers 230 have high etching selectivity for the insulating layers 220 and the first to third semiconductor layers 201A, 201B, and 201C, the sacrificial layers 230 may be removed by isotropic etching such as wet etching. At this time, the sacrificial layers 230 apart from the word line cut WLC by a distance greater than or equal to a set distance may not be removed.

According to some example embodiments, after providing a conductive material enough to sufficiently fill a space from which the sacrificial layers 230 are removed, the conductive material formed in the word line cut WLC may be removed by isotropic etching such as wet etching. Therefore, the stack structure SS including the gate electrodes 240 and the insulating layers 220 among the gate electrodes 240 may be provided.

According to some example embodiments, the gate electrodes 240 at the same vertical level from the substrate 101 may be separated by the word line cut WLC. In addition, the uppermost layers of the gate electrodes 240 may be separated by a string selection line cut SLC.

Then, the third upper insulating layer 275 filling the word line cut WLC and covering the second upper insulating layer 273 may be provided. According to some example embodiments, in a process of separating the gate electrodes 240 at different vertical levels, the gate electrodes 240 may be laterally recessed and the third upper insulating layer 275 may fill the recess.

Figure 11E:
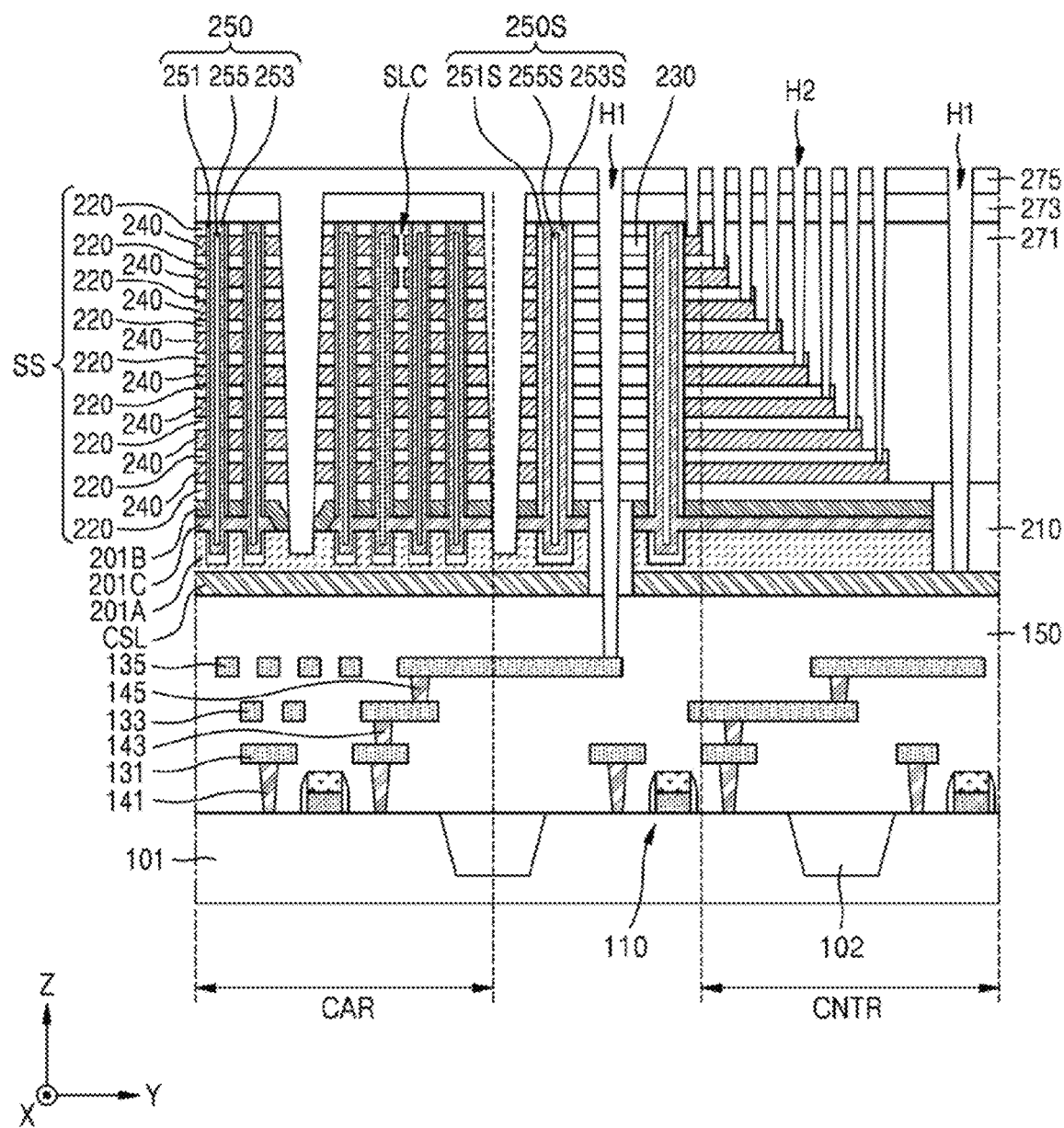

Then, referring to FIGS. 10, 11D, and 11E, in P250, first and second contact holes H1 and H2 may be formed.

The first and second contact holes H1 and H2 may be formed by a lithography process and an ion etching process of a high aspect ratio. According to some example embodiments, a second lithography process and a second ion etching process for forming the second contact holes H2 may be performed after a first lithography process and a first ion etching process for forming the first contact holes H1 are performed.

The first contact holes H1 may expose one of a top surface of the common source line plate CSL and a top surface of the peripheral conductive pattern 135. Each of the second contact holes H2 may expose a top surface of each of the gate electrodes 240 in the contact region CNTR.

As described above, the gate electrodes 240 in the contact region CNTR may configure a stair structure so that each of the gate electrodes 240 may protrude from an overlying one among the gate electrodes 240 in the Y direction. For example, as shown in at least FIGS. 11D and 11E, each of the gate electrodes 240 that underlies at least one of the gate electrodes 240 in the Z direction may protrude in the Y direction from an overlying gate electrode 240 of the gate electrodes. Therefore, each of the second contact holes H2 may expose a top surface of the uppermost one of vertically overlapping ones among the gate electrodes 240.

Then, referring to FIGS. 1, 10, and 11E, in P260, the second contact holes H2 may be measured.

The second contact holes H2 may be measured by one of the methods described with reference to FIGS. 2 and 7 to 9. The risk of a short circuit failure of second contact plugs 283 (refer to FIG. 11F) may be evaluated by measuring the second contact holes H2. According to some example embodiments, it may be determined whether the second contact holes H2 are excessively etched by measuring the second contact holes H2. According to some example embodiments, by measuring the second contact holes H2, it may be determined whether each of the second contact holes H2 exposes a top surface of one of the vertically overlapping gate electrodes 240 under the uppermost one.

For example, referring to FIGS. 4A-4C, the measuring at P260 may include measuring an image of the semiconductor device as shown in FIG. 11E (e.g., an image of an upper surface of the semiconductor device that exposes at least the second contact holes H2) which may be a differential image that is generated based on performing any one of the methods described with reference to FIGS. 2 and 7 to 9, where the measuring may include measuring the layers of the exposed second contact holes H2 in the image to determine whether a slope (e.g., corresponding to the slope IL2S shown in FIGS. 4A-4C) defining a lower portion of one or more of the second contact holes H2 is present. Based on generating the image as a differential image based on performing any one of the methods described with reference to FIGS. 2 and 7 to 9, the image may be a differential image that is an image for (e.g., an image based on) electrons in an energy band between the first energy E1 (refer to FIG. 3) and the second energy E2 (refer to FIG. 3) and thus may have improved sensitivity to electrons from a structure having an intermediate depth from the upper surface of the device shown in FIG. 11E (for example, a slope of one or more of the layers 220, the slope corresponding to slope IL2S shown in FIGS. 4A-4C). The differential image may be processed to identify the presence of the aforementioned slope in the insulation layer(s) 220 based on identifying a contrast between the exposed sidewall of the insulation layer(s) 220 in the exposed second contact hole(s) H2 and the exposed sidewall of the gate electrode(s) 240 and/or layers 271, 273, and/or 275, where the contrast (e.g., as shown in FIG. 4C) may enable determination that the imaged slope of an exposed insulation layer 220 indicates excessive etching of the second contact holes H2 to expose at least two gate electrodes 240 in a single second contact hole H2 (e.g., based on identifying the imaged slope of the exposed insulation layer 220 in the second contact hole H2 as a ring pattern between a central exposed underlying gate electrode 240 and an exposed overlying gate electrode 240, where the slope of the insulation layer 220 exposed in the second contact hole H2 may have improved contrast from the exposed gate electrode layers 240 based on the image being a differential image as described herein), such that the second contact hole H2 is determined to be excessively etched to expose the underlying gate electrode 240). Therefore, the measuring at S260 may include determining whether any of the second contact holes H2 are excessively etched.

Figure 11F:
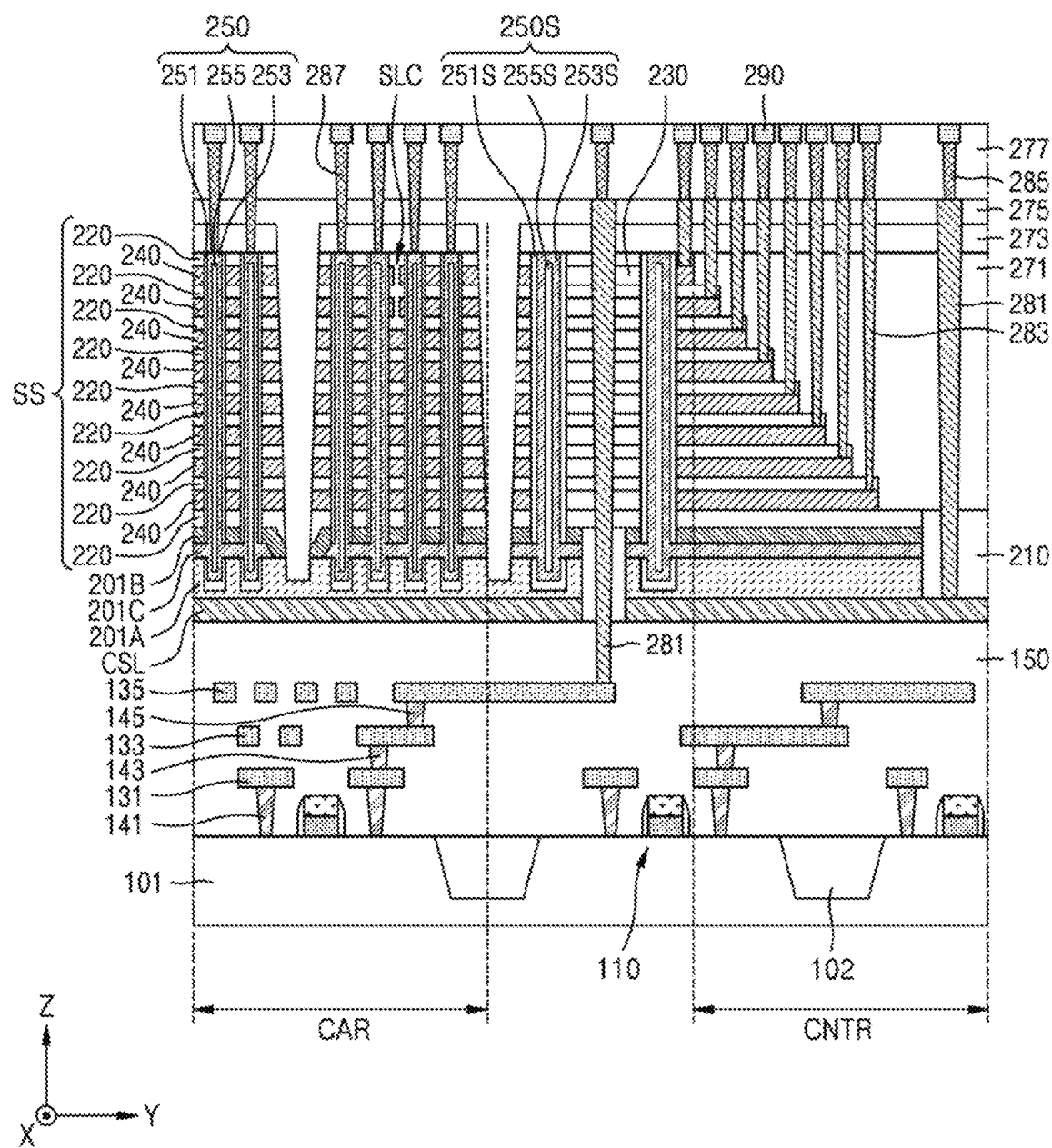

Then, referring to FIGS. 10, 11E, and 11F, in P270, first and second contact plugs 281 and 283 may be formed.

The first contact plugs 281 may be respectively formed in the first contact holes H1. Some of the first contact plugs 281 may contact the top surface of the common source line plate CSL, and the others of the first contact plugs 281 may contact the top surface of the peripheral conductive pattern 135. Each of the second contact plugs 283 may contact the top surface of each of the gate electrodes 240 at different levels.

The first and second contact plugs 281 and 283 may be formed by depositing a conductive material with high step coverage such as tungsten and performing a planarization process so that the conductive material in the first and second contact holes H1 and H2 may be separated.

Then, after providing a fourth upper insulating layer 277 on the first and second contact plugs 281 and 283 and the third upper insulating layer 275, an additional wiring process may be performed. Therefore, first conductive vias 285 connected to the first and second contact plugs 281 and 283, second conductive vias 287 connected to the channel structures 250, and conductive patterns 290 formed on the first and second conductive vias 285 and 287 may be provided.

Here, the conductive patterns 290 connected to the channel structures 250 may include bit lines and the conductive patterns 290 connected to the gate electrodes 240 may include word lines.

In some example embodiments, operation P270 may be selectively performed based on a determination at S260 of whether the measured second contact holes H2 are excessively etched. For example, in response to a determination at S260 that none of the second contact holes H2 of the device shown in FIG. 11E are excessively etched due to performing the measuring based on processing at least one differential image generated based on performing one of the methods of FIGS. 2 and 7-9, then operation P270 may be responsively performed to form the first and second contact plugs 281 and 283. In another example, in response to a determination at S260 that one or more second contact holes H2 of the device shown in FIG. 11E are excessively etched due to performing the measuring based on processing at least one differential image generated based on performing one of the methods of FIGS. 2 and 7-9, then operation P270 may be refrained from being performed on the semiconductor device, and the semiconductor device may be selectively discarded or forwarded for refurbishment and/or repair of the second contact holes H2 prior to re-measurement (e.g., repeated performance of P260 to generate an image of the refurbished/repaired semiconductor device). As a result, based on measuring the device at P260, the likelihood of forming contact plugs 283 in excessively etched second contact holes H2 may be reduced or prevented, such that the likelihood of semiconductor devices manufactured according to a process that includes the method shown in FIGS. 10 and 11A-11F having a contact plug 283 in an excessively etched second contact hole H2 may be reduced or prevented. Accordingly, a semiconductor device manufactured according to the method shown in FIGS. 10 and 11A-11F may have reduced or prevented likelihood of a second contact plug 283 that may contact two gate electrode layers 240 and experience a short circuit failure due to a short between the two gate electrode layers 240 contacting the second contact plug 283. Accordingly, a semiconductor device manufactured according to the method shown in FIGS. 10 and 11A-11F, and any electronic device including such a semiconductor device, may have improved reliability and thus improved performance, based at least in part upon reduced likelihood of short circuiting between gate electrode layers 240 in a given second contact plug 283, due to the method including selectively forming the second contact plugs 283 based on measuring the second contact holes H2 using a differential image generated by an SEM according to any of the example embodiments and pursuant to a method of inspecting a wafer according to any of the example embodiments (e.g., the method according to at least one of FIGS. 2 and/or 7-9).

While the inventive concepts have been particularly shown and described with reference to some example embodiments thereof, it will be understood that various changes in form and details may be made therein without departing from the spirit and scope of the following claims.

What is claimed is:

1. A scanning electron microscope (SEM), the SEM comprising:
   an electron gun configured to generate an input electron beam and to irradiate the input electron beam onto a wafer;
   a deflector on a path of the input electron beam between the electron gun and the wafer and configured to deflect the path of the input electron beam;
   an objective lens on the path of the input electron beam between the deflector and the wafer and configured to focus the input electron beam on the wafer;
   a first detector configured to detect a first portion of emission electrons emitted from the wafer based on the input electron beam being irradiated on the wafer, the first detector configured to generate a first image based on the first portion of the emission electrons;
   a second detector configured to detect a second portion of the emission electrons and to generate a second image based on the second portion of the emission electrons;
   a first energy filter configured to block electrons having energy less than a first energy among the emission electrons from being detected by the first detector;
   a second energy filter configured to block electrons having energy less than a second energy among the emission electrons from being detected by the second detector; and
   a processor configured to generate an image of the wafer based on a third portion of the emission electrons having energy between the first energy and the second energy, the processor configured to generate the image of the wafer based on the first image and the second image.

2. The SEM of claim 1, wherein the second energy filter is spaced apart from the path of the input electron beam.

3. The SEM of claim 2, wherein the first energy filter is spaced apart from the path of the input electron beam.

4. The SEM of claim 2, wherein the first energy filter is on the path of the input electron beam between the wafer and the objective lens.

5. The SEM of claim 4, wherein the first energy filter is configured to neutralize the wafer.

6. The SEM of claim 1, wherein the processor is configured to perform a differential operation on the first image and the second image to generate a differential image.

7. The SEM of claim 1, wherein the first energy is less than the second energy.

8. The SEM of claim 1, wherein each of the first and second energy filters is configured to block secondary electrons among the emission electrons.

9. The SEM of claim 1, wherein
   the first energy filter is configured to transmit Auger electrons, and
   the second energy filter is configured to block Auger electrons.

10. The SEM of claim 1, wherein each of the first energy and the second energy is greater than 50 eV.

11. A scanning electron microscope (SEM), the SEM comprising:
    an electron gun configured to generate an input electron beam and to irradiate the input electron beam onto a wafer;
    a deflector on a path of the input electron beam between the electron gun and the wafer and configured to deflect the path of the input electron beam;
    an objective lens on the path of the input electron beam between the deflector and the wafer and configured to focus the input electron beam on the wafer;
    a first energy filter on the path of the input electron beam between the objective lens and the wafer and configured to block electrons having energy less than a first energy among emission electrons emitted from the wafer based on the input electron beam being irradiated on the wafer, the first energy filter configured to neutralize charges induced to the wafer;
    a first detector configured to detect a first portion of the emission electrons and to generate a first image based on the first portion of the emission electrons; and
    a second detector configured to detect a second portion of the emission electrons and to generate a second image based on the second portion of the emission electrons.

12. The SEM of claim 11, further comprising a second energy filter configured to block electrons having energy less than a second energy among the emission electrons from being detected by the second detector.

13. The SEM of claim 12, wherein the second energy filter is spaced apart from the path of the input electron beam.

14. The SEM of claim 12, further comprising a processor configured to generate a differential image based on performing a differential operation on the first image and the second image.

15. The SEM of claim 14, wherein the differential image includes an image of the wafer, which is generated by third electrons among the emission electrons having energy between the first energy and the second energy.

16. A scanning electron microscope (SEM), the SEM comprising:
    an electron gun configured to generate an input electron beam and to irradiate the input electron beam onto a wafer;
    a deflector on a path of the input electron beam between the electron gun and the wafer and configured to deflect the path of the input electron beam;
    objective lenses on the path of the input electron beam between the deflector and the wafer and configured to focus the input electron beam on the wafer;
    an energy filter configured to block electrons having energy less than or equal to a blocking energy among emission electrons emitted from the wafer based on the input electron beam being irradiated on the wafer, the energy filter configured to control the blocking energy to be a first energy greater than 50 eV and a second energy greater than the first energy;
    a detector configured to sense a first portion of the emission electrons having energy greater than or equal to the first energy and a second portion of the emission electrons having energy greater than or equal to the second energy; and a processor configured to perform a differential operation on a signal generated by the first portion of the emission electrons having energy greater than or equal to the first energy and another signal generated by a third portion of the emission electrons having energy less than or equal to the second energy.

17. The SEM of claim 16, wherein
the detector is configured to generate
- a first image based on the first portion of the emission electrons having energy greater than or equal to the first energy, and
- a second image based on the second portion of the emission electrons having energy greater than or equal to the second energy, and the processor is configured to generate a differential image based on performing a first differential operation on the first image and the second image.

18. The SEM of claim 16, wherein
the detector is configured to generate a first line image based on the first portion of the emission electrons having energy greater than or equal to the first energy and a second line image based on the second portion of the emission electrons having energy greater than or equal to the second energy, each of the first and second line images includes
- a plurality of pixels in a first direction, and
- one pixel in a second direction perpendicular to the first direction, and the processor is configured to generate a differential line image based on performing a first differential operation on the first line image and the second line image.

19. The SEM of claim 16, wherein
the detector is configured to generate
- a first signal based on the first portion of the emission electrons having energy greater than or equal to the first energy, which are emitted from a first point of the wafer, and
- a second signal based on the second portion of the emission electrons having energy greater than or equal to the second energy, which are emitted from the first point of the wafer, and the processor is configured to generate a differential signal based on performing a first differential operation on the first signal and the second signal.

20. The SEM of claim 16, wherein
the energy filter is on the path of the input electron beam between the wafer and the objective lenses, and
the energy filter is configured to neutralize charges induced to the wafer.

* * * * *